(12) United States Patent
Gurer et al.

(10) Patent No.: US 7,030,039 B2
(45) Date of Patent: Apr. 18, 2006

(54) METHOD OF UNIFORMLY COATING A SUBSTRATE

(75) Inventors: Emir Gurer, Scotts Valley, CA (US); Tom Zhong, Santa Clara, CA (US); John Lewellen, San Jose, CA (US); Edward C. Lee, Cupertino, CA (US); Robert P. Mandal, Saratoga, CA (US); James C. Grambow, San Jose, CA (US); Ted C. Bettes, Newark, CA (US); Donald R. Sauer, San Jose, CA (US); Edmond R. Ward, Monte Sereno, CA (US); Jung-Hoon Chun, Sudbury, MA (US); Sangjun Han, Cambridge, MA (US)

(73) Assignee: ASML Holding N.V., La Veldhoven (NL)

( * ) Notice: Subject to any disclaimer, the term of this patent is extended or adjusted under 35 U.S.C. 154(b) by 215 days.

(21) Appl. No.: 09/895,787

(22) Filed: Jun. 30, 2001

(65) Prior Publication Data

US 2002/0098283 A1 Jul. 25, 2002

(51) Int. Cl.
*H01L 21/312* (2006.01)

(52) U.S. Cl. ............... 438/780; 435/782; 427/240; 427/346; 427/270.1; 118/320

(58) Field of Classification Search ............. 438/780, 438/782; 427/240, 346; 118/320; 430/270.1
See application file for complete search history.

(56) References Cited

U.S. PATENT DOCUMENTS

| 3,198,657 | A | 8/1965 | Kimball et al. | |
| 4,068,019 | A | 1/1978 | Boeckl | 427/82 |
| 4,113,492 | A | 9/1978 | Sato et al. | 96/67 |
| 4,132,357 | A | 1/1979 | Blackinton | 239/11 |
| 4,267,212 | A | 5/1981 | Sakawaki | 427/240 |
| 4,347,302 | A | 8/1982 | Gotman | 430/270 |
| 4,393,807 | A | 7/1983 | Fujimura et al. | 118/501 |
| 4,438,159 | A | 3/1984 | Weber | 427/162 |
| 4,451,507 | A | 5/1984 | Beltz et al. | 427/240 |

(Continued)

FOREIGN PATENT DOCUMENTS

| DE | 279033 | 5/1990 |
| JP | 46-10790 | 3/1971 |
| JP | 46-42658 | 12/1971 |

(Continued)

OTHER PUBLICATIONS

J. Van Schoot et al., "The Mask Error: Causes and Implications for Process Latitude" (Part of the SPIE Conference on Optical Microlithography XII), Mar. 1999, p. 250–260, SPIE vol. 3679, Santa Clara, CA.

(Continued)

*Primary Examiner*—Barbara L. Gilliam
(74) *Attorney, Agent, or Firm*—Blakely, Sokoloff, Taylor & Zafman

(57) ABSTRACT

A method of and an apparatus for coating a substrate with a polymer solution to produce a film of uniform thickness, includes mounting the substrate inside an enclosed housing and passing a control gas, which may be a solvent vapor-bearing gas into the housing through an inlet. The polymer solution is deposited onto the surface of the substrate in the housing and the substrate is then spun. The control gas and any solvent vapor and particulate contaminants suspended in the control gas are exhausted from the housing through an outlet and the solvent vapor concentration is controlled by controlling the temperature of the housing and the solvent from which the solvent vapor-bearing gas is produced. Instead the concentration can be controlled by mixing gases having different solvent concentrations. The humidity of the gas may also be controlled.

32 Claims, 14 Drawing Sheets

U.S. PATENT DOCUMENTS

| | | | | |
|---|---|---|---|---|
| 4,510,176 | A | 4/1985 | Cuthbert et al. | 427/82 |
| 4,514,440 | A | 4/1985 | Justice et al. | 427/85 |
| 4,518,678 | A | 5/1985 | Allen | 430/311 |
| 4,551,355 | A | 11/1985 | Ericson et al. | |
| 4,600,597 | A | 7/1986 | White et al. | 427/9 |
| 4,732,785 | A | 3/1988 | Brewer | 427/240 |
| 4,741,926 | A | 5/1988 | White et al. | 427/240 |
| 4,800,836 | A | 1/1989 | Yamamoto et al. | 118/52 |
| 4,822,639 | A | 4/1989 | Fujii et al. | 427/240 |
| 4,886,012 | A | 12/1989 | Ikeno et al. | 118/667 |
| 4,932,353 | A | 6/1990 | Kawata et al. | 118/302 |
| 4,946,710 | A | 8/1990 | Miller et al. | 427/126.3 |
| 4,963,390 | A | 10/1990 | Lipeles et al. | 427/110 |
| 5,013,586 | A | 5/1991 | Cavazza | 427/240 |
| 5,066,616 | A | 11/1991 | Gordon | 437/229 |
| 5,094,884 | A | 3/1992 | Hillman et al. | 427/240 |
| 5,095,848 | A | 3/1992 | Ikeno | 118/53 |
| 5,127,362 | A | 7/1992 | Iwatsu et al. | 118/667 |
| 5,134,962 | A | 8/1992 | Amada et al. | 118/688 |
| 5,135,608 | A | 8/1992 | Okutani | 156/643 |
| 5,143,552 | A | 9/1992 | Moriyama | 118/666 |
| 5,158,860 | A | 10/1992 | Gulla et al. | 430/315 |
| 5,180,431 | A | 1/1993 | Sugimoto et al. | 118/52 |
| 5,198,034 | A | 3/1993 | deBoer et al. | 118/725 |
| 5,234,499 | A | 8/1993 | Sasaki et al. | 118/52 |
| 5,238,713 | A | 8/1993 | Sago et al. | 427/240 |
| 5,264,246 | A | 11/1993 | Ikeno | 427/240 |
| 5,271,955 | A | 12/1993 | Maniar | 427/100 |
| 5,318,800 | A | 6/1994 | Gong et al. | 427/229 |
| 5,358,740 | A | 10/1994 | Bornside et al. | 427/240 |
| 5,366,757 | A | 11/1994 | Lin | 427/9 |
| 5,378,511 | A | 1/1995 | Cardinali et al. | 427/600 |
| 5,391,393 | A | 2/1995 | Maniar | 427/100 |
| 5,395,803 | A | 3/1995 | Adams | 437/229 |
| 5,449,405 | A | 9/1995 | Cardinali et al. | 118/50 |
| 5,472,502 | A | 12/1995 | Batchelder | 118/52 |
| 5,532,192 | A | 7/1996 | Adams | 437/229 |
| 5,670,210 | A | 9/1997 | Mandal et al. | |
| 5,762,709 | A | 6/1998 | Sugimoto et al. | 118/52 |
| 5,954,878 | A | 9/1999 | Mandal et al. | 118/319 |
| 5,985,363 | A | 11/1999 | Shiau et al. | |
| 6,027,760 | A * | 2/2000 | Gurer et al. | 427/8 |
| 6,191,053 | B1 * | 2/2001 | Chun et al. | 438/780 |
| 6,238,735 | B1 | 5/2001 | Mandal et al. | 427/240 |
| 6,248,168 | B1 * | 6/2001 | Takeshita et al. | 118/52 |
| 6,317,642 | B1 * | 11/2001 | You et al. | 700/121 |
| 6,387,825 | B1 * | 5/2002 | You et al. | 438/782 |
| 6,407,009 | B1 * | 6/2002 | You et al. | 438/782 |
| 6,468,951 | B1 * | 10/2002 | Grieger et al. | 510/175 |
| 2001/0017103 | A1 * | 8/2001 | Takeshita et al. | 118/50 |
| 2001/0033895 | A1 * | 10/2001 | Minami et al. | 427/240 |
| 2002/0127334 | A1 * | 9/2002 | Gurer et al. | 427/240 |
| 2002/0150691 | A1 * | 10/2002 | Kitano et al. | 427/421 |

FOREIGN PATENT DOCUMENTS

| | | | |
|---|---|---|---|
| JP | 57-45369 | 3/1982 | |
| JP | 57-130432 | 8/1982 | |
| JP | 61-02925 | 6/1984 | |
| JP | 60-10248 | 1/1985 | |
| JP | 60-226125 | 11/1985 | |
| JP | 61-29125 | 2/1986 | |
| JP | 0176119 | 8/1986 | 118/52 |
| JP | 0206224 | 9/1986 | 118/52 |
| JP | 0092316 | 4/1987 | 118/52 |
| JP | 62-225269 | 10/1987 | |
| JP | 63-032921 | 2/1988 | |
| JP | 0085626 | 4/1988 | 118/52 |
| JP | 63-119531 | 5/1988 | |
| JP | 63-301520 A | 12/1988 | |
| JP | 64-27667 | 1/1989 | |
| JP | 1-238017 | 9/1989 | |
| JP | 0098126 | 4/1990 | 118/52 |
| JP | 2-98126 | 4/1990 | |
| JP | 2-119226 | 5/1990 | |
| JP | 3-22428 A | 1/1991 | |
| JP | 3-41715 | 2/1991 | |
| JP | 3175617 A | 7/1991 | |
| JP | 4-9823 | 1/1992 | |
| JP | 4-62915 | 2/1992 | |
| JP | 4-104158 | 4/1992 | |
| JP | 4-332116 A | 11/1992 | |
| JP | 04-361524 | 12/1992 | |
| JP | 05-021306 | 1/1993 | |
| JP | 05-141058 | 6/1993 | |
| JP | 5-166712 | 7/1993 | |
| JP | 6-170316 A | 6/1994 | |
| JP | 8-168715 A | 7/1996 | |
| WO | WO 98/57757 | 12/1998 | |

OTHER PUBLICATIONS

F.M. Schellenberg et al., "Impact of Mask Error on Full Chip Error Budgets", (Part of the SPIE Conference on Optical Microlithography XII), Mar. 1999, p. 261–275, SPIE vol. 3679, Santa Clara, CA.

M.S. Krishna et al., "Characterization of Advanced DUV PhotoResists", (Part of the SPIE Conference on Advances in Resist Technology and Processing XVI), Mar. 1999, p. 607–614, SPIE vol. 3678, Santa Clara, CA.

J. Lewellen et al., "Effect of PEB Temperature Profile on CD and DUV Resists", (Part of the SPIE Conference on Process, Equipment, and Materials Control in Integrated Circuit Manufacturing V), Mar. 1999, p. 45–54, SPIE vol. 3882, Santa Clara, CA.

D.E. Bornside et al., "Spin Coating: One–dimensional mode", J. Appl. Phys. 66(11), Dec. 1989, p. 5185–5193, American Institute of Physics.

R. Kobayashi et al., "Contributed Papers—Spiral Vortices in boundary Layer Transition Regime on a Rotating Disk" Acta Mechanica, 1980, p. 35, 71–82 (14 pages total), vol. 35/1–2, Springer–Verlag, Wien, New York.

R.M. Crowell, "Determining Photoresist Coat Sensitivities of 300 mm Wafers", Feb. 1998, p. 414–419 (7 pages total) SPIE vol. 3331, Santa Clara, CA.

B. Lorefice et al., "How to Minimize Resist Usage During Spin Coating", Semiconductor International, Jun. 1998, p. 179–190 (14 pages total), vol. 21, No. 6.

L. Peters, "Solving the Integration Challenges of Low–K Dielectrics", Nov. 1999, p. 56–64 (11 pages total), Semiconductor International, vol. 22, No. 13.

D.E. Bornside, "Spin Coating", Aug. 1988, (201 pages total), Ph.D. Thesis, University of Minnesota.

J. Derksen, "A New Coating Method for Semiconductor Lithography: Fluid Layer Overlap In Extrusion–Spin Coating", Jun. 1997, (67 pages total), Massachusetts Institute of Technology.

S. Han, Modeling and Analysis of Extrusion–Spin Coating: An Efficient and Deterministic Photoresist Coating Method of Microlithography, Feb. 2001, 179 pages, Massachusetts Institute of Technology.

Bagen, Susan, et al., Extrusion Coating of Polymer Films for Low–Cost Flat Panel Display Manufacturing, 1996 Display Manufacturing Technology Conference, Digest of Technical Papers, pp. 35–36 (1996).

Bixler, Nathan Ephraim, Stability Of A Coating Flow, PhD Dissertation submitted to the University of Minnesota, Jun. 1982.

Bornside, David, E., et al., The effects of gas phase convection on mass transfer in spin coating, Journal of Applied Physics, vol. 73, No. 2, Jan. 15, 1993, pp. 585–600, © 1993 American Institute of Physics.

Bornside, D.E., et al., On the Modeling of Spin Coating, Journal of Imaging Technology, vol. 13, No. 4, Aug. 1987, pp. 122–130, © 1987, SPSE—The Society of Imaging Science and Technology.

Cohen, et al., Modern Coating And Drying Technology, Chapter 4, Premetered Coating, pp. 117–167, VCH Publishers, Inc., (1992).

Emslie, Alfred G., et al., Flow of a Viscous Liquid on a Rotating Disk, Journal Of Applied Physics, vol. 29, No. 5, May 1958, pp. 858–862.

Fraysse, Nathalie, et al., An experimental study of rivulet instabilities in centrifugal spin coating of viscous Newtonian and non–Newtonian fluids, Physics of Fluids, vol. 6, No. 4, Apr. 1994, pp. 1491–1504, © 1994 American Institute of Physics.

Gutoff, Edgar B, et al., Coating and Drying Defects, Troubleshooting Operating Problems, Chapter V, pp. 96–138, A Wiley–Interscience Publication, John Wiley & Sons, New York Chichester Brisbane Toronto Singapore (1992).

Gutoff, Edgar B., Simplified Design of Coating Die Internals, Journal Of Imaging Science And Technology, vol. 37, No. 6, Nov./Dec. 1993, pp. 615–627, © 1993, I S & T—The Society for Imaging Science and Technology.

Hafizi, B., Effects of carrier and dispersion on propagation of a directed electromagnetic pulse, Journal of Applied Physics, vol. 73, No. 2, Jan. 15, 1993, pp. 513–521, © 1993 American Institute of Physics.

Higgins, B.G., et al., Capillary Pressure And Viscous Pressure Drop Set Bounds On Coating Bead Operability, Chemical Engineering Science, vol. 35, pp. 673–682, Pergamon Press Ltd. 1980, Printed in Great Britain.

Lawrence, C.J., The mechanics of spin coating of polymer films, Physics of Fluids, vol. 31, No. 10, Oct. 1988, pp. 2786–2795, © 1988 American Institute of Physics.

Lee, Kwong–Yang, et al., Minimum Wet Thickness In Extrusion Slot Coating, Chemical Engineering Science, vol. 47, No. 7, pp. 1703–1713, © 1992 Pergamon Press plc, Printed in Great Britain.

Meyerhofer, Dietrich, Characteristics of resist films produced by spinning, Journal of Applied Physics, vol. 49, No. 7, Jul. 1978, pp. 3993–3997, © 1978 American Institute of Physics.

Mues, W., et al., Observation of a Dynamic Wetting Process Using Laser–Dopper Velocimetry, AIChE Journal, vol. 35, No. 9, Sep. 1989, pp. 1521–1526.

Ruschak, Kenneth J., Limiting Flow In A Pre–Metered Coating Device, Chemical Engineering Science, 1976, vol. 31, pp. 1057–1060, Pergamon Press. Printed in Great Britain.

Sukanek, Peter C., Spin Coating, Journal of Imaging Technology, vol. 11, No. 4, Aug. 1985, pp. 184–190, © 1985, Society of Photographic Scientists and Engineers.

Sartor, Luigi, Slot coating: Fluid mechanics And die design, PhD Dissertation submitted to the University of Minnesota, Sep. 1990.

Derksen, James, et al., Extrusion–Spin Coating: An Efficient Photoresist Coating Process for Wafers, 1999 IEEE International Symposium On Semiconductor Manufacturing Conference Proceedings, (ISSM'99) Santa Clara, CA., Oct. 11–13, 1999, IEEE International Symposium On Semiconductor Manufacturing, New York, NY, Oct. 11, 1999, pp. 245–248, XP000933095.

Search Report for PCT/US 02/05187, mailed Nov. 6, 2002, 5 pages.

Van Zant, Peter, "Microchip Fabrication. A practical Guide to Semiconductor Processing." Published, 1986 by Semiconductor Services, San Jose, Calif., pp. 116–117.

Wolf, Stanley Ph.D and Tauber, Richard N. Ph.D., Silicon Processing For the VLSI Era, vol. 1: Process Technology, published by Lattice Press, Calif., pp. 429–430.

* cited by examiner

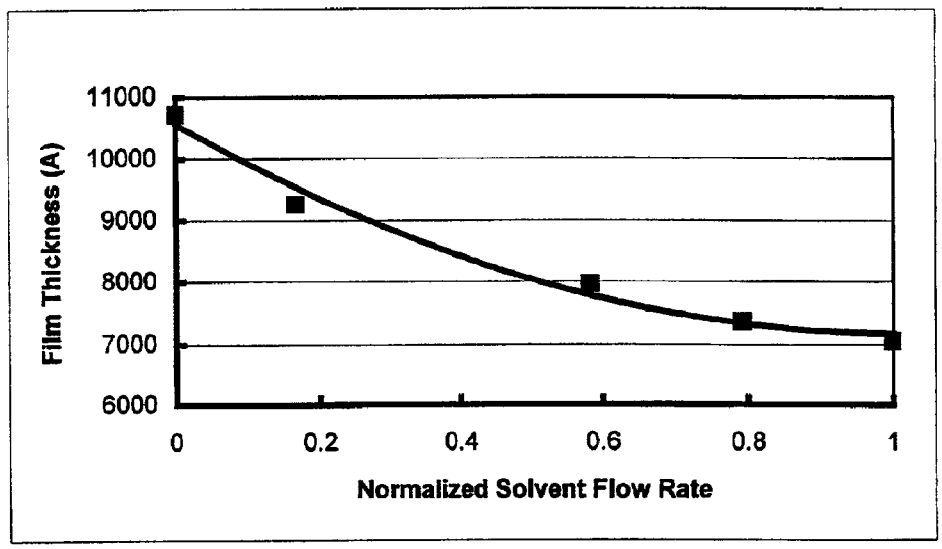
Figure 3a) Mean resist film thickness as a function of solvent concentration at a fixed drying spin speed. Mean film thickness can be varied close to 4000Å by varying the solvent concentration at a fixed 2000 rpm.
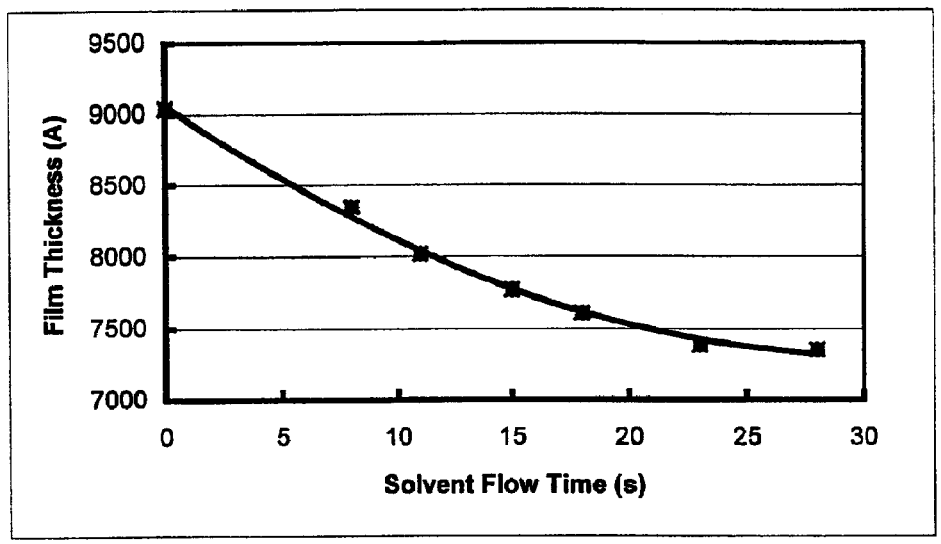
Figure 3b): Film thickness as a function of solvent flow time for a working example.

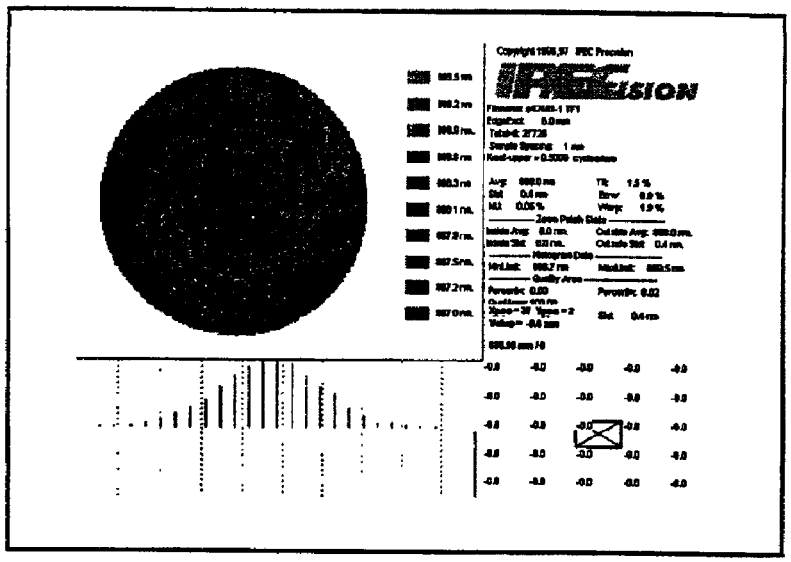
Figure 4: A typical film thickness profile, as measured by 30,000 pts film thickness measurement tool, has a 1σ uniformity of 4Å (0.045%) for 8880Å target thickness.
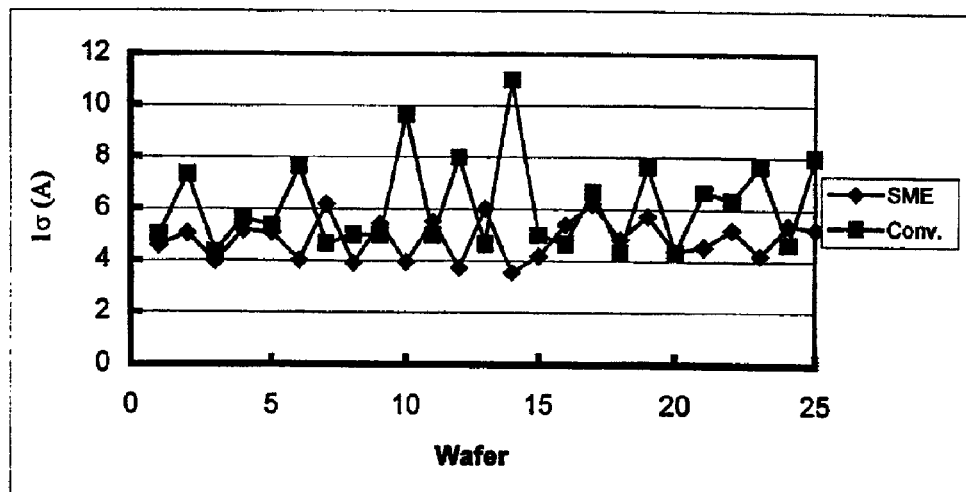
|  | Conventional Coater | Invention |
|---|---|---|
| 1σ$_{ave}$ | 5.67A | 4.86A |
| 1σ$_{band}$ | 4.5A | 2.2A |
Figure 5) Film uniformity comparison between the invention (SME) and conventional spin coaters.

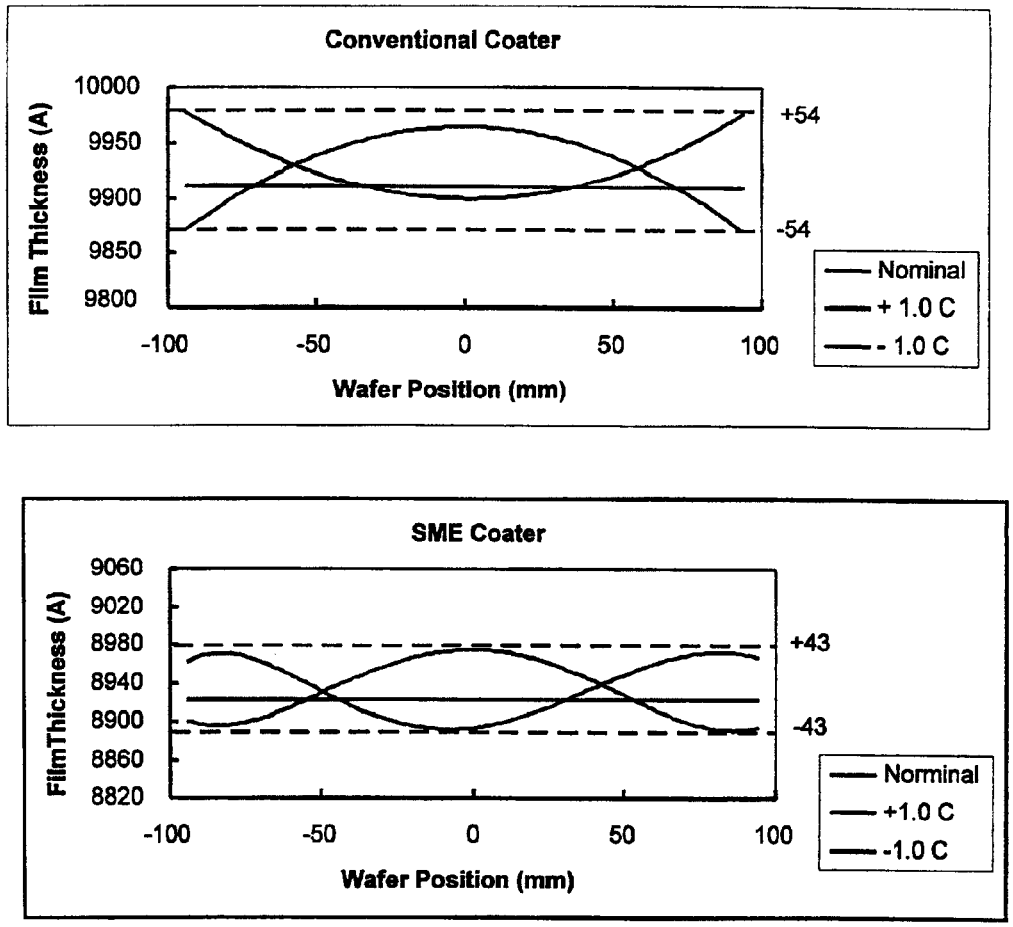
Figure 6: Resist temperature latitude comparison between the invention (SME) and conventional coaters for 200mm wafers. The SME coater resist temperature latitude of film uniformity is 36% wider than that of a conventional coater.

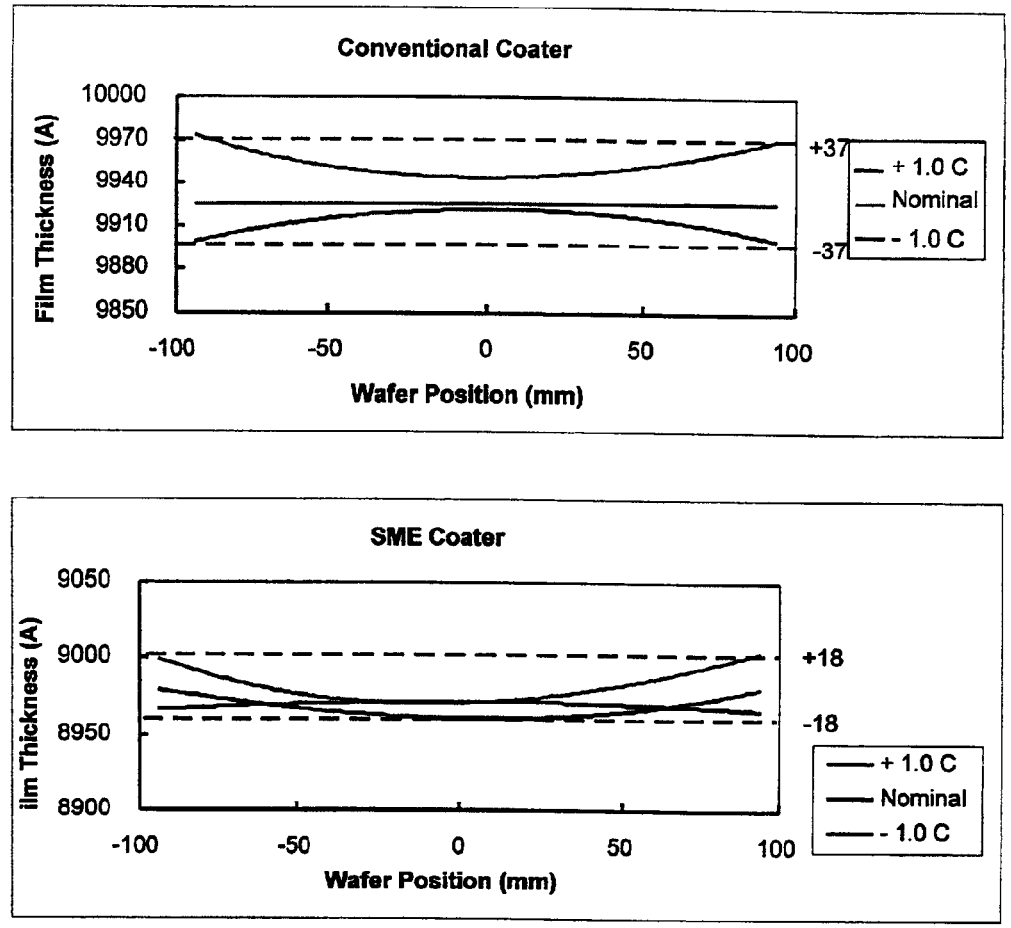
Figure 7: Chill plate temperature latitude comparison of the invention (SME) and conventional coaters for 200mm wafers. The SME coater chill plate temperature latitude of film uniformity is 43% wider than that of a conventional coater.

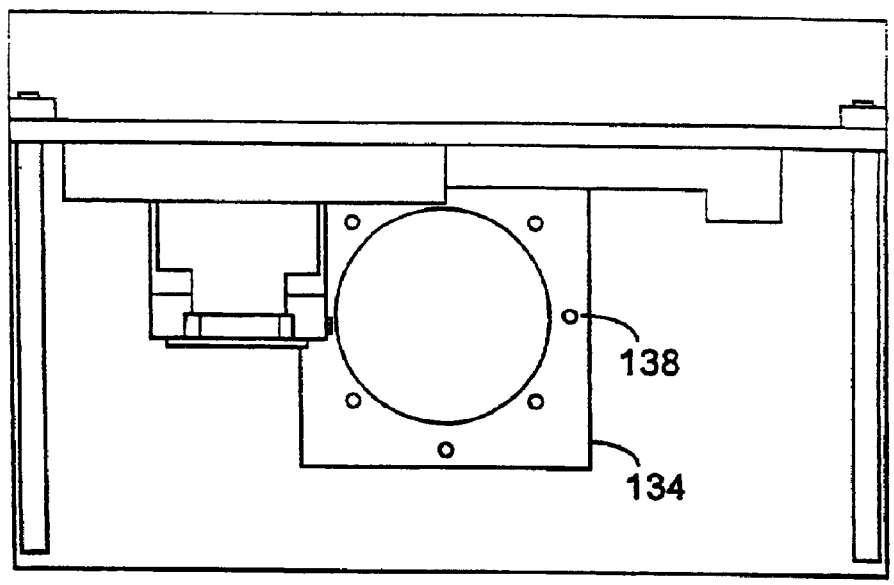
FIG. 17
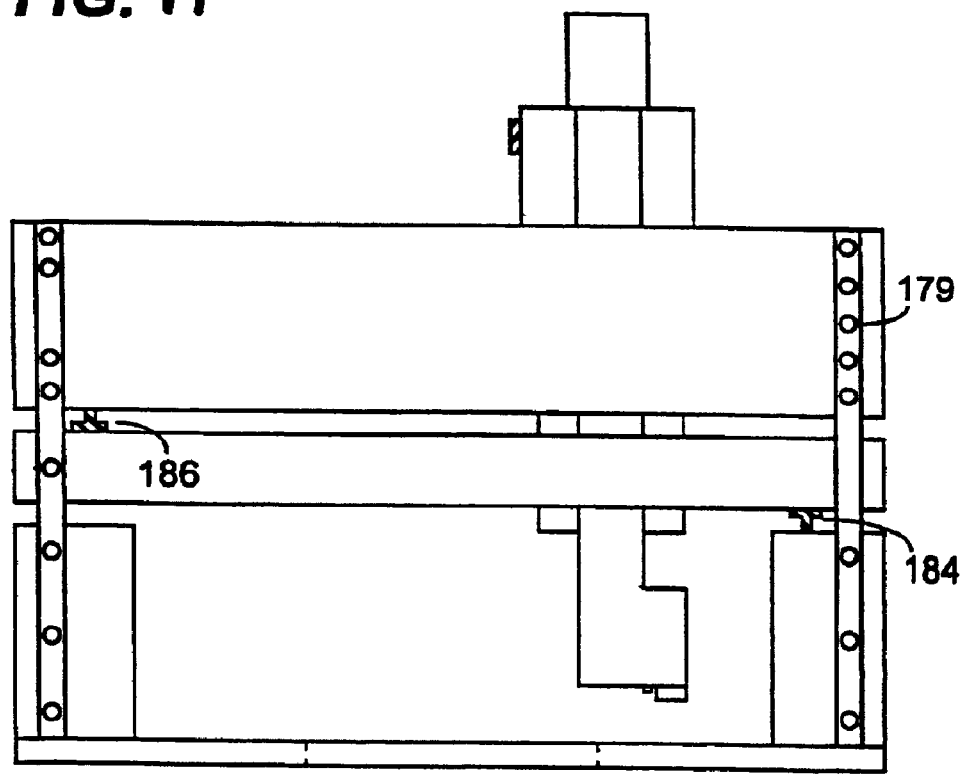
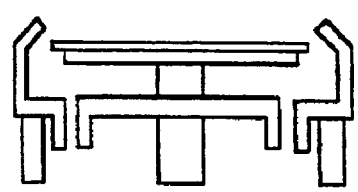
FIG. 18

METHOD OF UNIFORMLY COATING A SUBSTRATE

CROSS-REFERENCE TO RELATED APPLICATIONS

This application is a continuation-in-part of U.S. patent application Ser. No. 09/745,611 filed Dec. 20, 2000. This application is also continuation-in-part of U.S. patent application Ser. No. 09/98924 Feb. 28, 2001, which claims the benefit of provision U.S. patent application Ser. No. 60/185,818 filed Feb. 29, 2000. This application is also a continuation-in-part of U.S. patent application Ser. No. 09/391,964 filed Sep. 8, 1999 which is a continuation of U.S. patent application Ser. No. 08/876,273 filed Jun. 16, 1997 (now U.S. Pat. No. 5,954,878) which is a divisional of U.S. patent application Ser. No. 08/566,227 filed Dec. 1, 1995 (now U.S. Pat. No. 5,670,210) which is a continuation-in-part of U.S. patent application Ser. No. 08/330,045 filed Oct. 27, 1994 (now abandoned), all applications of which are incorporated herein by reference in their entirety.

BACKGROUND OF THE INVENTION

The manufacture of integrated circuits involves the transfer of geometric shapes on a mask to the surface of a semiconductor wafer. Thereafter the semiconductor wafer corresponding to the geometric shapes or corresponding to the areas between the geometric shapes is etched away. The transfer of the shapes from the mask to the semiconductor wafer typically involves a lithographic process. This includes applying a photosensitive pre-polymer solution to the semiconductor wafer. The solvent in the pre-polymer solution is removed by evaporation, and the resulting polymer film is then baked. The film is exposed to radiation, for example ultraviolet light, through a photomask supporting the desired geometric patterns. The images in the photosensitive material are then developed by soaking the wafer in a developing solution. The exposed or unexposed areas are removed in the developing process, depending on the nature of the photosensitive material. Thereafter the wafer is placed in an etching solution that etches away the areas not protected by the photosensitive material. Due to their resistance to the etching process, the photosensitive materials are also known as photoresists. These may for instance be sensitive to ultraviolet light, electron beams, x-rays, or ion beams.

The high cost of the photoresist pre-polymer solutions makes it desirable to devise methods of improving the efficiency of the coating process so as to minimize the polymer solution's consumption. Furthermore, thickness uniformity of the photoresist layer is an important criterion in the manufacture of integrated circuits. It ensures satisfactory reproduction of the geometric patterns on the semiconductor wafer.

The solvent in the photoresist tends to evaporate during application, increasing the viscosity of the polymer solution and inhibiting the leveling of the resulting film. This produces thickness non-uniformities. It is therefore desirable to be able to control the rate of evaporation of solvent from the polymer solution.

Environmental humidity is one of the factors affecting the thickness of the photoresist layer. Typically photoresist coating uniformity of the order of 15 to 20 angstroms within a wafer and 20 to 25 angstroms from one wafer to the next and from batch to batch and from day to day is required. This is less than the effect of a 1% difference in relative humidity. Furthermore, in commonly used positive photoresists employing photosensitive diazoquinone compounds, some water content is required to react with products of the photolytic reaction to form required water-soluble carboxylic acids.

OBJECTS AND SUMMARY OF THE INVENTION

It is an object of the invention to provide a method of and an apparatus for improving the thickness uniformity of a polymer solution applied to a surface of a substrate such as a semiconductor wafer.

It is a further object of the invention to improve the consumption of polymer solutions such as photoresist pre-polymer solutions used in the coating of substrates.

According to the invention, there is provided a method of coating a surface of a substrate with a polymer solution which includes mounting the substrate inside an enclosed housing, passing a control gas into the housing through an inlet, depositing the polymer solution onto the surface of the substrate in the housing, spinning the substrate, and exhausting the control gas and any solvent vapor and particulate contaminants suspended in the control gas from the housing through an outlet.

The control gas can be a solvent vapor-bearing gas or a solvent-free gas.

The step of exhausting the control gas and any solvent vapor and contaminants can be performed before, during, or after the deposition step.

The solvent vapor-bearing gas is typically produced by bubbling a gas through a solvent and can include the step of controlling the solvent vapor concentration of the solvent vapor-bearing gas by controlling the temperature of the solvent. The solvent vapor concentration of the solvent vapor-bearing gas can also be controlled by controlling the temperature of the housing or by mixing the solvent vapor-bearing gas with a second gas having a different solvent vapor concentration.

The solvent vapor-bearing gas typically comprises air or an inert gas such as nitrogen.

The control gas can be passed into the housing through a showerhead dispenser located directly above the substrate to ensure continuous, controlled, laminar gas flow over the wafer.

The polymer solution can contain a photoresist polymer, for example, a deep-ultraviolet photoresist polymer.

The method can include the step of passing temperature controlled solvent-free, dry, filtered gas over the coated substrate. The method can also include the step of passing solvent-free, humid gas over the coated substrate; the humidity of the humid gas can be controlled to have the relative humidity required by the polymer solution. The relative humidity lies typically in the range of 40% to 45%. The temperature of the humid gas can also be controlled by means of a temperature and humidity controller.

The step of mounting the substrate in the housing can include securing the substrate to a rotatable chuck, for example, by establishing a vacuum between the substrate and the chuck.

The substrate typically comprises a semiconductor wafer and the solute content in the polymer solution is typically 10% to 50% by weight.

Further, according to the invention there is provided a coating apparatus for coating a surface of a substrate with a polymer solution which includes an enclosed housing, a rotatable chuck mounted in the housing for supporting the substrate, a depositing means for depositing the polymer solution onto the surface of the substrate in the housing, a control gas supply means connected in flow communication with the housing for supplying a control gas to the housing, and an exhaust means connected to the housing for exhausting the control gas and any solvent vapor and particulate contaminants from the housing.

The depositing means can include a dispensing head means mounted above the chuck for dispensing a stream of the polymer solution onto the surface of the substrate, the dispensing head means being moveable relative to the substrate. If the substrate has a substantially circular shape, the dispensing head means is typically moveable substantially radially across the surface of the substrate.

The depositing means can instead comprise a film extruding means having an extrusion head mounted above the chuck for dispensing a stream of the polymer solution onto the surface of the substrate. In this case, if the substrate is substantially circular in shape, the extrusion head is typically mounted above the chuck for dispensing a radially extending stream of the polymer solution onto the surface of the substrate.

Particular embodiments employ extrusion methods and apparatae that are described in U.S. Pat. No. 6,191,053 and Sanjun Han, "Modeling and Analysis of Extrusion Spin Coating: An Efficient and Deterministic Photoresist Coating Method in Microlithography," Ph.D. Thesis, Massachusetts Institute of Technology, Department of Mechanical Engineering (2001), both of which are hereby incorporated in their entirety by reference. In these embodiments, a ribbon of material is extruded in a spiral pattern that covers the entire top surface of a wafer. A wafer is mounted on a chuck, aligned horizontally and oriented upward. An extrusion head is positioned adjacent to the outer edge of the wafer and above the top surface of the wafer with an extrusion slot aligned radially with respect to the wafer. The wafer is rotated and the extrusion head moved radially toward the center of the wafer while material is extruded out the extrusion slot. The rotation rate of the wafer and the radial speed of the extrusion head are controlled so that the tangential velocity of the extrusion head with respect to the rotating wafer is a constant.

As described, a rotatable chuck is connected to a variable speed motor, and the coating apparatus can include a controlling means for controlling the speed of the variable speed motor. The housing can have an upstream side and a downstream side; the solvent vapor-bearing gas supply means can include an inlet to the housing mounted at the upstream side of the housing, and the exhaust means can include an outlet mounted at the downstream side of the housing. The control gas supply means can include conduits connected in flow communication with the housing, and electrically-controlled valves in at least one of the conduits for controlling the rate of control gas flowing into the housing and the composition of the control gas. The exhaust means can also include a valve means for controlling the exhaustion of the gas and any contaminants from the housing. The solvent vapor-bearing gas supply means can include a clean, dry, filtered gas source and a bubbler connected in flow communication with the housing.

The coating apparatus can, further, include a temperature and humidity controlled gas source connected in flow communication with the housing. The temperature and humidity controlled gas source can include a temperature control means and humidity control means for controlling the temperature and humidity of the gas supplied by the temperature and humidity controlled gas source.

BRIEF DESCRIPTION OF THE DRAWINGS

FIG. 3a shows film thickness as a function of solvent flow rate at a fixed spin speed.

FIG. 3b shows film thickness as a function of solvent flow time.

FIG. 4 shows a typical film thickness profile across a wafer.

FIG. 5 shows a film uniformity comparison between the invention and the prior art.

FIG. 6 shows a resist temperature latitude comparison between the invention and the prior art.

FIG. 7 shows a comparison between the invention and the prior art with respect to chill plate temperature latitude.

FIGS. 16, 17 and 18 are a front view, top view and rear view, respectively of an extrusion spin coating assembly of the invention.

DETAILED DESCRIPTION OF THE INVENTION

Figure 1:
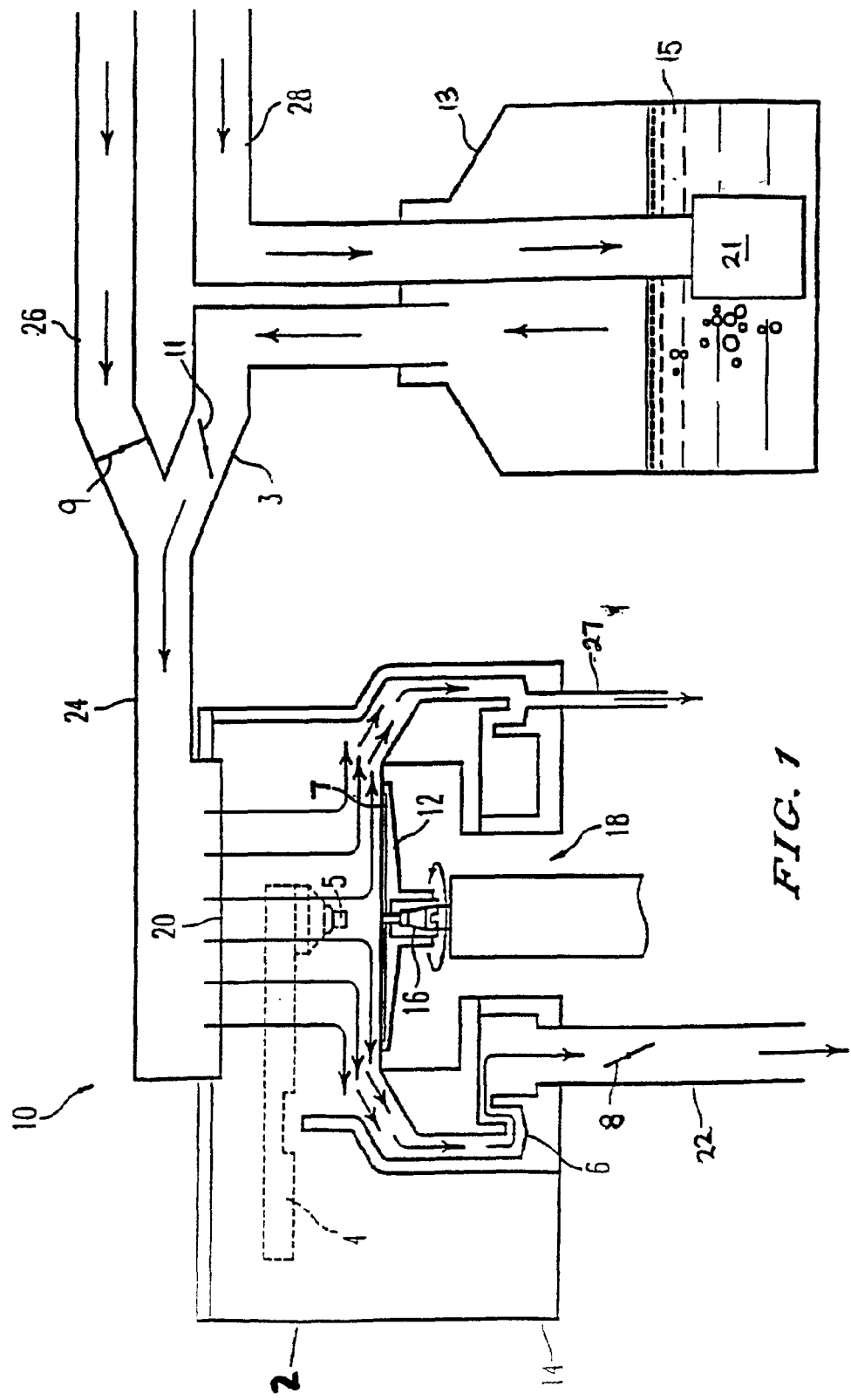
FIG. 1 shows a schematic sectional side view of one embodiment of a spin coating arrangement in accordance with the invention.

This invention pertains to a method of improving the thickness uniformity of coatings formed when depositing solutions on substrates. It pertains further to a method of reducing the wastage of such solutions. In particular, the method will be described with reference to semiconductor wafers used in the manufacture of integrated circuits and the application of photoresist pre-polymer solutions to a surface of a semiconductor wafer. It will be appreciated that films or coatings used in integrated circuit manufacture are not limited to photoresist layers and could, for example, include materials such as organic planarization films, anti-reflection films, siloxane spin-on-glass films, polyimide films, and polyimide siloxane films.

As mentioned above the solute content in these materials prior to the coating process typically ranges from 10% to 50% by weight.

As will become clearer from the discussion which follows below it is desirable to conduct the coating process of the semiconductor wafer in a housing or chamber which allows the atmosphere in the chamber to be at least partially saturated with solvent molecules. This has the advantage of improving the cast film wetability by establishing a monolayer coating of solvent on the surfaces of the substrate. Furthermore by controlling the concentration of solvent in the gas within the chamber, thickness uniformity of the polymer solution film on the substrate can be improved. This will be the case whether spin-cast films, spray-coated films or any other similar coating method is adopted.

In a spin-cast method, a solution is applied to the substrate while the substrate is either stationary, moving linearly, or rotating. Thereafter the substrate is spun to spread the solution over the surface of the substrate. After the solution has spread over the substrate surface, the solvent in the solution is removed by evaporation leaving a layer of solute on the surface of the substrate. As substrate sizes are increased or when attempts are made to reduce costs by minimizing the amount of fluid applied to the surface of the substrate, a non-uniform thickness in the solute layer on the substrate typically results. This is, in part, a result of the difference in tangential velocity between the periphery and the center of the substrate. The non-uniform airflow along the periphery causes non-uniform evaporation of solvent, thereby producing coating thickness non-uniformities. Since the larger substrates require higher spin speeds to obtain uniformity near the center, spirals and striations result near the periphery of the substrate due to non-uniform interaction with the air in contact with the solution near the periphery. These features are known as Ekman spirals.

Problems are also encountered when insufficient coating solution is used. When attempts are made to reduce costs by minimizing the amount of the coating solution applied to the surface of the substrate during spin-casting, non-uniformities are created due to the low solvent volume. Evaporation of the solvent during the coating process results in various defects and irregularities. Similarly, in spray-coated films, solvent tends to evaporate during the application, thus increasing viscosity and inhibiting the leveling of the resulting film, again resulting in thickness non-uniformities.

As mentioned above, certain photoresists require some water content to react with products of the photolytic reaction. For these reasons, it is desirable to be able to control the humidity of the air in the chamber.

The invention will now be described in greater detail with respect to embodiments making use of a spin-coating process. In these embodiments the substrate is a semiconductor wafer and the solution applied to the semiconductor wafer is a photoresist pre-polymer solution.

FIG. 1 shows an embodiment of a spin-coating arrangement 10 used in accordance with the method of the invention. The arrangement 10 includes a rotatable support chuck 12 mounted in an enclosed housing 14. The chuck 12 extends into an axle 16 that passes through an opening 18 in the housing 14. The housing 14 includes an input in the form of a shower-head-like dispenser 20. This allows control gas, comprising a gas and a certain concentration of solvent to be passed into the housing 14. The control gas can be a solvent-free gas or a solvent-bearing gas and can include air or an inert gas such as nitrogen. The dispenser 20 is mounted directly above the substrate that is mounted on the chuck 12. An input conduit 24 extends into the shower-head-like dispenser 20 at its one end. A temperature and humidity controlled gas source (not shown) supplying temperature and humidity controlled air or nitrogen is connected to the conduit 24 by means of a conduit 26. A second conduit 28 extends from a clean, dry, filtered gas source into a bubbler 21. The bubbler 21 is housed in a solvent tank 13 containing a solvent 15. The clean, dry, filtered gas, which typically comprises air or nitrogen, is passed through the bubbler 21 to form a solvent-bearing gas which is channeled to the conduit 24 by means of a conduit 3. A valve 9 is mounted in the conduit 26 and a valve 11 is mounted in the conduit 3. The valves 9, 11 allow either one or both the temperature and humidity-controlled gas and the solvent-bearing gas to be channeled to the housing 14. The valves 9, 11 are typically electrically-controlled valves for automated control of gas flow rates and compositions. The temperature of the solvent-bearing gas supplied by the bubbler 21 is controlled by means of heating/cooling coils that control the temperature of the gas supplied by the conduit 28 or of the solution 15 or both. Normally heat must be supplied to the solvent 15 to compensate for heat loss due to evaporation. The temperature and humidity of the temperature and humidity controlled gas are also controlled using a special temperature and humidity controller comprising a refrigeration unit, a boiler, and a temperature and humidity sensor. Instead the temperature and humidity of the temperature and humidity controlled gas can be controlled by means of a temperature and humidity controller employing a bubbler arrangement. In a preferred embodiment, the conduit 26 is supplied by two branch conduits (not shown). This allows connection to either a bubbler or a humidity-controlled source. The bubbler is typically mounted in an outer housing containing the remainder of the arrangement 10. In contrast the special humidity controller proposed above comprises a separate structure. When humid air is supplied the relative humidity is maintained at a level required by the polymer solution: typically between 40% and 45%. Clearly the humidity can be kept at zero in appropriate circumstances.

The arrangement 10 further includes a dispensing head 4 for dripping a solution (in this case a photoresist pre-polymer solution) onto a wafer 7 mounted on the chuck 12.

The bottom of the housing 14 defines an annular channel 6 having an exhaust 22 for gas such as air or nitrogen, and a drain 27 for liquid.

In a typical process the semiconductor wafer 7 is secured to the chuck 12 using any standard method such as a vacuum established between the chuck 12 and the wafer 7. A wafer transport door 2 to the housing 14 is thereafter closed. The housing 14 is purged with dry solvent-free gas. Control gas is then fed into the housing. The solvent concentration of the control gas can be controlled before, during and after the coating solution is dispensed onto the substrate. By manipulating the valves 9 and 11, the solvent is passed along the conduit 3 through the valve 11, along the conduit 24, and into the housing 14. A controlled partial pressure of solvent can be achieved by bubbling the gas, comprising nitrogen or air, through the bubbler 21. The bubbler 21 in this embodiment includes a porous glass frit from which the gas is passed through the liquid solvent 15 which is maintained at an appropriate set temperature. The resultant solvent-bearing gas, containing the appropriate concentration of solvent, is passed over the semiconductor wafer prior to and during the coating process. Clearly the solvent tank 13 must contain or be supplied with sufficient solvent to allow the desired solvent concentration in the solvent-bearing gas to be maintained.

Figure 2:
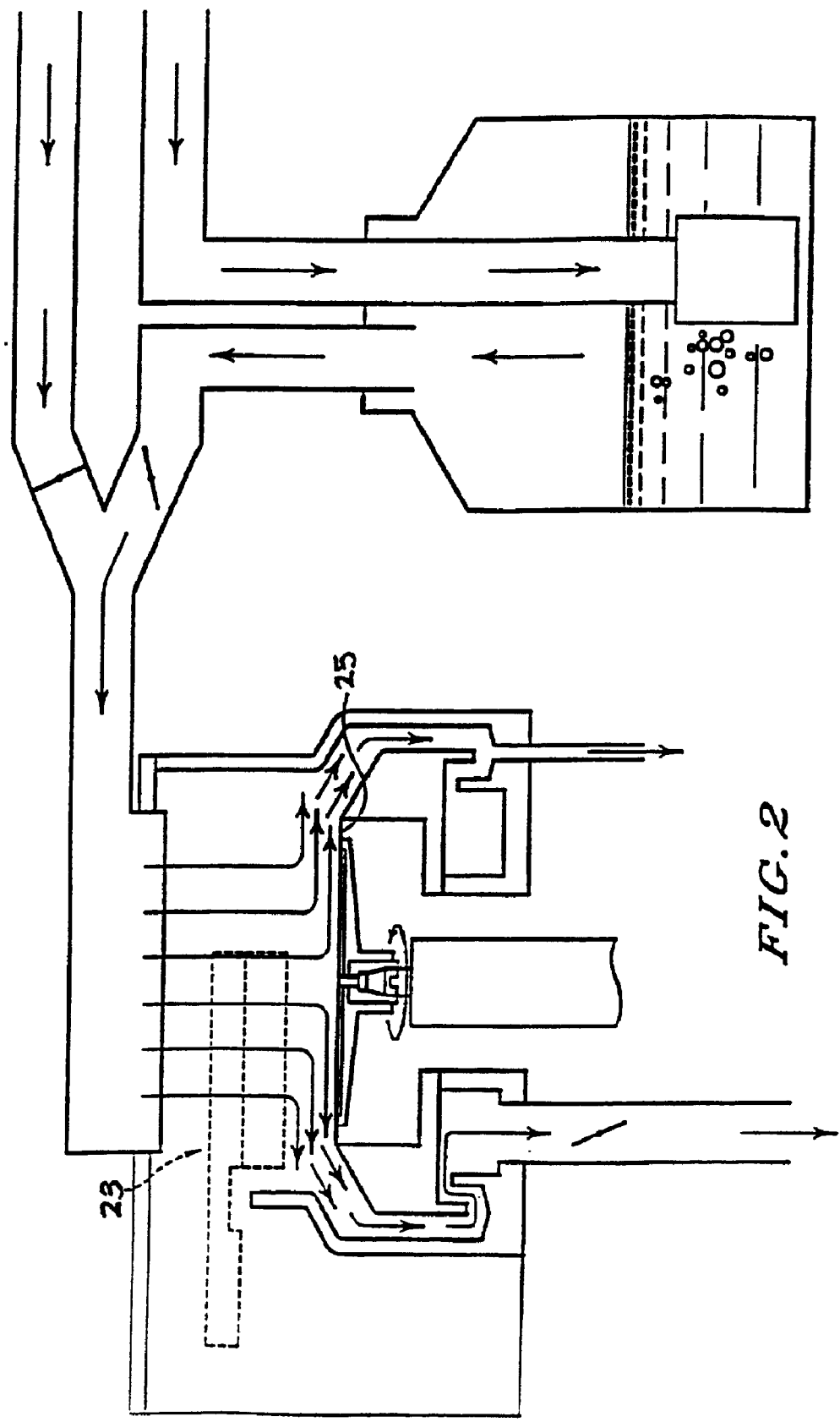
FIG. 2 shows a schematic sectional side view of another embodiment of a spin coating arrangement in accordance with the invention.

In order to deposit a layer of photoresist onto the wafer 7, the polymer solution is applied across the surface of the wafer 7 via the dispensing head 4. This is achieved by dispensing the polymer solution in a continuous stream from a nozzle 5 onto the wafer 7 while the wafer 7 is spinning at relatively low speed or while it is stationary. In the preferred embodiment, the nozzle 5 is moved substantially radially across the wafer 7. Instead, the solution can be dispensed at the center of the substrate, or multiple nozzles can be used. By adjusting the spin speed of the wafer 7, the movement of the nozzle 2 and the rate at which the polymer solution is dispensed, a suitable distribution of the solution can be achieved. In another embodiment, as illustrated in FIG. 2, the polymer solution is deposited onto the wafer by means of a film extruder 23, which is a conventional extruder known in the art, while the wafer is rotated by one full turn. The extruder 23, deposits a film of polymer solution onto the wafer 25. If a wafer not having a substantially circular shape, is to be coated, the wafer is typically moved longitudinally during the polymer solution deposition step.

Since the extruder process is otherwise identical to the FIG. 1 embodiment, the process will be described with reference to FIG. 1. After the solution has been deposited on the wafer 7, the spin speed of the wafer 7 is increased to spread the solution across the upper surface of the wafer 7. By exhausting the solvent-containing gas and any particulate contaminants suspended in the solvent-bearing gas via the exhaust 22, before and during the coating of the wafer 7, a uniform layer of photoresist pre-polymer solution can be formed on the upper surface of the wafer 7. Thereafter the gas passed into the chamber via the conduit 24 is switched to temperature and humidity controlled solvent-free gas such as air or nitrogen by means of the valves 9, and 11. The valves 9 and 11 are typically controlled by a microprocessor (not shown). The solvent concentration in the control gas is then decreased or the temperature of the control gas increased to remove more of the solvent in the polymer solution deposited on the wafer 7. Typically, a solvent-free gas is supplied to the housing to enhance the evaporation of the solvent from the polymer solution. When the desired amount of evaporation has taken place to form a sufficiently hard layer of photoresist, the wafer 7 is stopped, the wafer transport door opened, and the coated wafer removed from the housing 14. As mentioned above, gas, which may be dry or humid, solvent-free or solvent-bearing gas, is removed from the housing 14 during the various stages via the exhaust 22. In this way the gas is channeled to pass over the wafer 7 from an upstream side at the shower-head dispenser 20 to a downstream side at the exhaust 22. The exhaust flow is controllable by means of a valve 8, thereby allowing the gas pressure in the housing 7 to be controlled. The valve 8 is typically controlled by means of a microprocessor (not shown). Any polymer solution spun off, including particulate contaminants, is collected in the annular channel 6 to be removed via the drain 27.

As discussed above the temperatures of the liquid solvent or gas supplied to the bubbler 21 is adjustable. In this way the partial pressure of solvent in the solvent-bearing gas can be adjusted. This can be achieved by making use of heating/cooling coils as described above. Instead the concentration can be adjusted by adding a gas bearing a different solvent concentration. This could be supplied via a conduit (not shown) connected to the conduit 3. Clearly if the temperatures of the bubbler and the housing 14 are the same, the solvent-bearing gas will be saturated with solvent. If the temperature of the bubbler is higher, the solvent-bearing gas in the housing 14 will be super saturated, and if the temperature of the bubbler is lower, the solvent-bearing gas in the housing 14 will be unsaturated. Typically the solvent-bearing gas supplied by the bubbler 21, and the housing 14 will be kept at the same temperature to maintain solvent saturation. As mentioned above, the arrangement 10 is typically mounted in an outer housing (not shown). The outer housing is temperature controlled to maintain it and the components of the arrangement 10 at a temperature of typically 22° C.

Usually the solvent contained in the bubbler and borne by the gas will be the same as that contained in the solution deposited on the wafer. Similarly, if the solution contains more than one solvent, the bubbler may contain similar solvents in the same ratios. However it may be desirable in certain circumstances to use different solvents in the bubbler as compared to the solvents in the solution deposited on the wafer.

It will be appreciated that a solvent-bearing gas can be produced using techniques other than a bubbler.

Solvent vapor pressure can be determined precisely by using an isoteniscope. Alternatively, by passing inert gas through a sample of the solution and measuring the amount of solvent removed as a function of time gravimetrically, the vapor pressure can be determined precisely. The solvent partial pressure in the gas supplied by the conduit 3 can be adjusted, optimally to correspond to the equilibrium vapor pressure created by the solvent in the polymer solution. This ensures that the rate at which solvent evaporates from the deposited film or coating is equal to the rate at which the solvent is absorbed by the film from the gaseous environment.

As mentioned above the solvent partial pressure in the housing 14 can be adjusted by controlling the temperature of the bubbler or gas. Alternatively, a gas containing a different solvent concentration can be mixed with the solvent-saturated gas. The optimum profile of solvent partial pressure in the housing atmosphere as a function of time during the coating process can be determined empirically.

By continuously exhausting the solvent-bearing gas or humid air via the exhaust 22, humidity and solvent partial pressure in the housing can readily be adjusted during the coating process to ensure a uniform solution layer thickness on the semiconductor wafer surface. Similarly the effects of premature evaporation of solvent from the polymer solution deposited on the wafer 7 can be eliminated. This allows less polymer solution to be used, thereby reducing costs.

WORKING EXAMPLES

I. Spin Coater:

A spin coating apparatus sized appropriately for 200 mm diameter wafers was assembled and installed in a wafer track machine. In-situ air pressure, air temperature, relative humidity and solvent concentration measurements were performed during the wafer processing. Ethyl lactate was used as the casting solvent for the photoresist. Solvent concentration within the process chamber was varied between 0-40% of the saturated value.

FIGS. 3*a* and 3*b* demonstrate results obtained by practicing a method according to the invention. As shown in FIGS. 3*a* and 3*b*, final film thickness can be varied by controlling solvent evaporation independent of the spin speed. In the limit of zero solvent flow rate, the evaporation rate is maximum, yielding the thickest film due to coupled nature of convective and evaporative mass transfer mechanisms. As the solvent flow rate is increased evaporation rate is reduced allowing resist film to continue thinning via convective diffusion for a longer time. As a result, practicing the invention can vary final film thickness by 4000 Å at a fixed spin speed of 2000 rpm, as shown in FIG. 3a. In a similar way, solvent flow time can affect the final film thickness as shown in FIG. 3b. These data clearly demonstrate that the invention provides a solution for the turbulence wall problem of 300 mm substrates. By practicing the invention, spin speed can be kept below 2000 rpm and wider range of useful thickness can be obtained by optimizing two new process variables, solvent concentration and solvent flow times.

FIG. 4 demonstrates wafer uniformity. One sigma uniformity of 4.0 Å was routinely obtained as measured by a high spatial resolution film thickness measurement tool.

FIG. 5 compares the uniformity results of a cassette of wafers processed according to the invention to that of a conventional coater. These results demonstrate that the invention minimizes the impact of the turbulence wall and is capable of producing wafers with tighter uniformity control than a conventional coater.

FIG. 6 compares the resist temperature process latitude of a coater according to the invention to that of a conventional coater. Resist temperature sensitivity of 1σ uniformity is 25 Å/C for the conventional coater compared to 16 Å/C according to the invention (using SPR508 resist for both). This represents a increase in resist temperature latitude of 36%.

FIG. 7 shows that chill plate (wafer) temperature sensitivity of 1σ uniformity is 7 Å/C for conventional coater dropping to 4 Å/C for the invention, an increase in CP temperature latitude of 43%.

Taken together, the above results indicate that there is reduced dependency of the film profiles on the evaporation-related process variables when practicing the invention. This is a direct result of suppression of evaporation during the critical phases of the spin coating and indicate that practicing the invention resolves two major problems associated with 300 mm substrates.

While particular embodiments provide the advantages, above, the invention is clearly not limited to those embodiments. The conduit 28 could, for instance, be connected directly to the conduit 3. In this way the gas supplied by the temperature and humidity controlled source could also supply the bubbler 21. The humidity of the temperature and humidity controlled source would simply be reduced to zero while supplying the bubbler 21. When dry or moist gas is to be supplied to the housing 14, a valve in the conduit 28 could be closed to insure that no solvent is sucked up the conduit 28.

It should be noted that when certain advanced deep ultra-violet photoresist materials are used, a moisture-free casting environment can be used. Accordingly the humidity of the temperature and humidity controlled gas will be kept at zero.

II. Extrusion Coater:

The invention is not limited to spin-coating embodiments. For example, numerous embodiments employ extrusion-coating. A particular set of embodiments use extrusion slot coating to dispense a thin ribbon of photoresist over the entire surface of the wafer. Non-limiting examples of extrusion slot coating are described in U.S. Pat. No. 6,191,053, and Sanjun Han, "Modeling and Analysis of Extrusion Spin Coating: An Efficient and Deterministic Photoresist Coating Method in Microlithography," Ph.D. Thesis, Massachusetts Institute of Technology, Department of Mechanical Engineering (2001), both of which are hereby incorporated in their entirety by reference. Extrusion slot coating is a member of the class of pre-metered coating methods. With extrusion slot coating, the coating thickness can be controlled by the photoresist dispense rate, the efficiency can be near 100%, and the thickness uniformity is very good.

Figure 8:
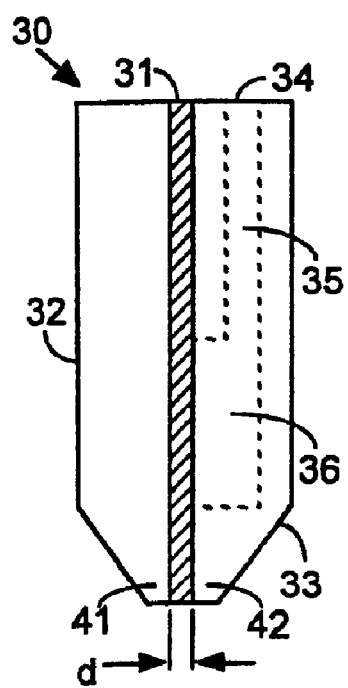
FIG. 8 is an assembly drawing of a side view of an extrusion head of the invention.
Figure 9:
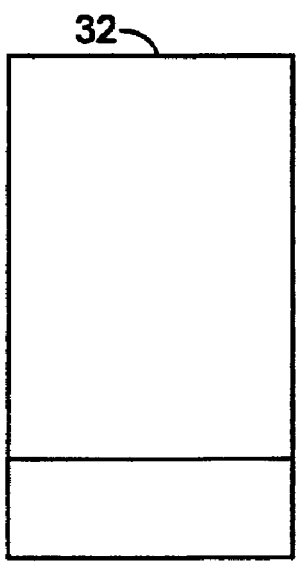
FIG. 9 is a front view of a front plate of an extrusion head of the invention.
Figure 10:
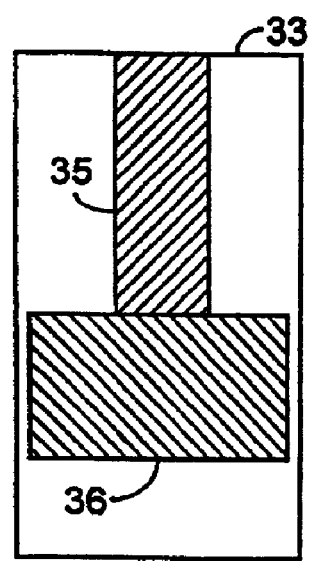
FIG. 10 is a front view of a rear plate of an extrusion head of the invention.
Figure 11:
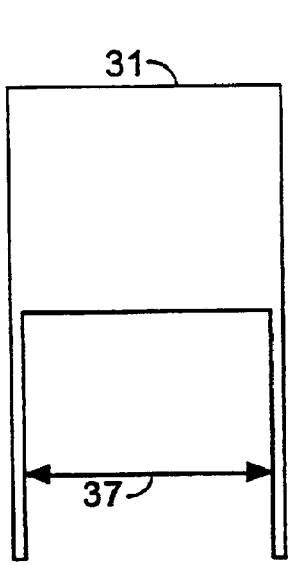
FIG. 11 is a front view of a shim of an extrusion head of the invention.
Figure 12:
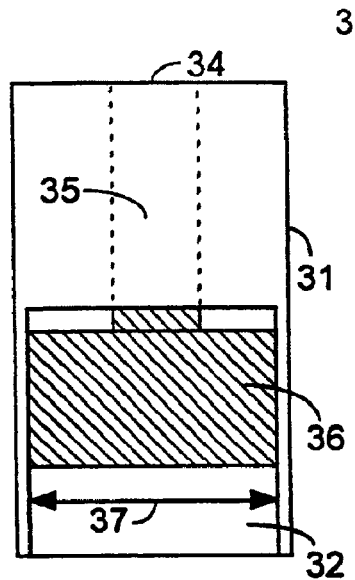
FIG. 12 is a front view of a shim against a back plate.

In extrusion slot coating, the photoresist is extruded onto the wafer through a narrow slot. FIGS. 8–15 illustrate an embodiment of an extrusion head 30 that may be used in the invention. The extrusion head 30 may also be referred to as an extrusion die. FIG. 8 shows a side assembly view of the extrusion head 30 which is constructed of a stainless steel U-shaped shim 31 sandwiched between a stainless steel front plate 32 and a stainless steel back plate 33. FIGS. 9, 10 and 11 show a front view of the front plate 32, back plate 33, and shim 31, respectively. FIG. 12 shows a front view of the shim 31 against the back plate 33. Referring to FIG. 8, the front plate 32 and back plate 33 are grounded and polished on their inner edges, facing the shim 31, to provide good seal with the shim 31 and a smooth surface for extrusion. Photoresist enters the extrusion head 30 through a port 34 in the top of the back plate 33. The port 34 directs the photoresist through a tube 35 to a flow channel 36 (FIGS. 8, 10). The flow channel 36 is as wide as the opening of the "U" 37 of the shim 31 (FIGS. 11, 12).

Figure 13:
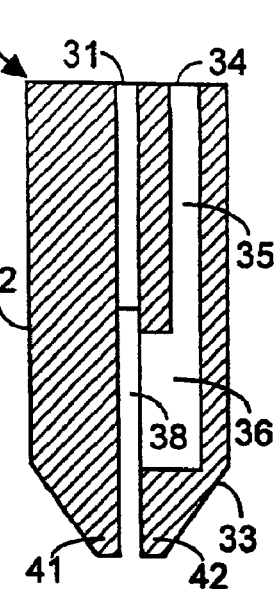
FIG. 13 is a cross sectional view of an assembled extrusion head of the invention.

FIG. 13 is a sectional view of the extrusion head 30 illustrated in FIG. 8. The void created by the u-shape of the shim 31 leaves a narrow gap 38 between the front plate 32 and back plate 33 through which photoresist can flow. At the base of the extrusion head 30, the gap 38 continues downward between two narrow "lips" 41, 42 which extend the inner surface of the front plate 32 and back plate 33.

Figure 14:
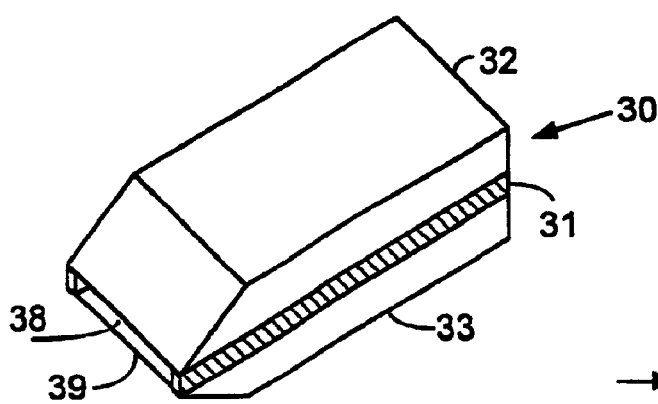
FIG. 14 is a perspective view of an assembled extrusion head of the invention.

FIG. 14 is a perspective view of the extrusion head illustrated in FIG. 8. The gap 38 extends across the opening of the "U" 37 (FIGS. 11, 12) of the shim 31 to form an extrusion slot 39 in the extrusion head 30.

Figure 15:
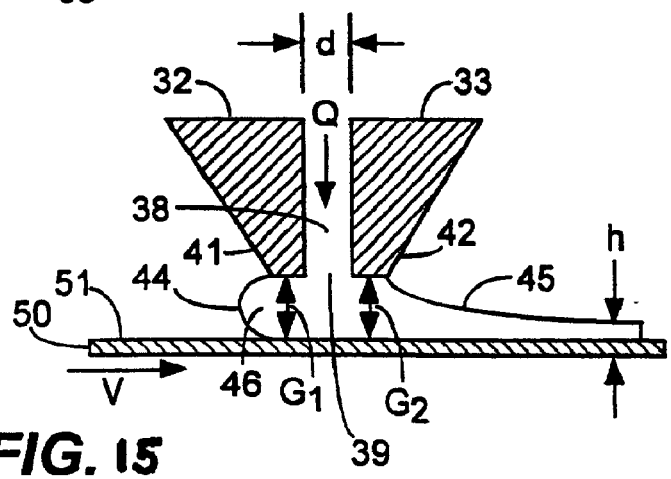
FIG. 15 is a cross sectional view of the lips of an extrusion head with a substrate moving beneath the lips of the extrusion head.
Figure 1B:
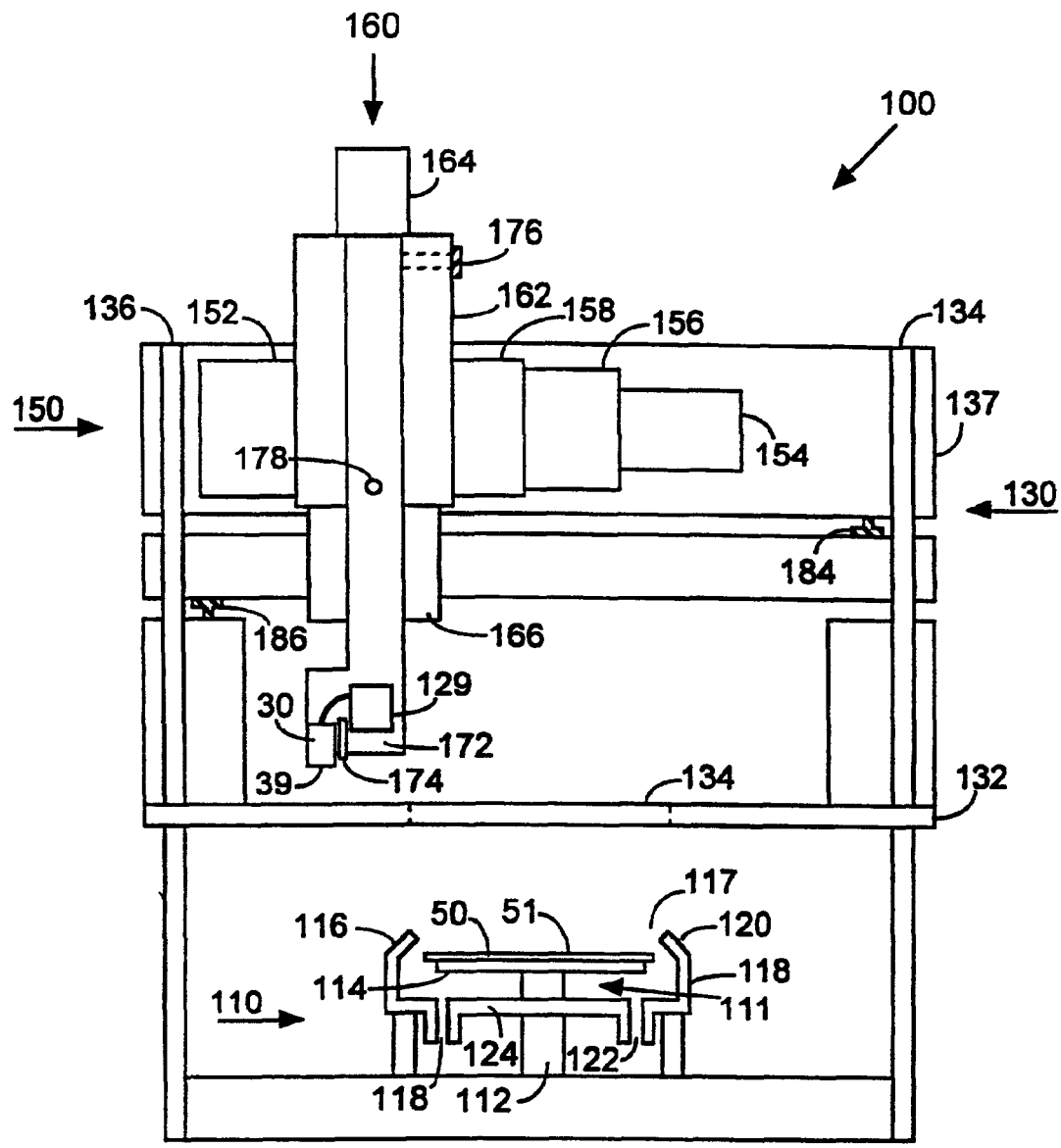

FIG. 15 is a cross sectional view of the lips 41, 42 of an extrusion head 30 with a substrate 50 moving beneath the extrusion lips 41, 42. Photoresist is extruded out the slot 39 at the base of the lips 41, 42 onto the top surface 51 of the substrate 50. The width of the gap 38 between the front plate 32 and rear plate 33, indicated as d, is equal to the thickness of the shim 31 (FIGS. 8, 13). The coating gap between the lips 41, 42 and the substrate 50 is filled with a bead 46 of coating fluid coming from the slot 39. When the substrate 50 is moved perpendicular to the slot 39, keeping the coating gap constant, fluid is drawn out of the bead 46 and remains as a thin film on the substrate 50. The width of the extruded film, w (FIGS. 23, 24) is approximately equal to the length of the extrusion slot 39, i.e. the opening of the "U" 37 of the shim 31 (FIGS. 11, 12). The average thickness of the extruded film, h, is $$h = \frac{Q}{wv}$$

where v is the coating speed, and Q is the fluid dispense rate. The menisci 44, 45 at the leading and trailing edges of the coating bead 46 are pinned to the corners of the extrusion head lips 41, 42. The corners of the extrusion head lips 41, 42 should have a radius of curvature less than approximately 50 μm to keep the menisci 44, 45 pinned. The capillary, viscous, and inlet pressures in the coating bead 46 must balance the external pressure to maintain stability in the coating bead 46. A slight vacuum at the leading edge of the coating bead 46 can be used to stabilize the coating bead 46 when coating thinner films or at higher coating speeds. The extrusion head lips 41, 42 are normally of equal length ($G_1=G_2$) and the extrusion head 30 is perpendicular to the substrate 50. For very thin coatings, however, it is sometimes beneficial to have one of the lips extend beyond the other ($G_1 \neq G_2$) or to have the extrusion head 30 slightly tilted from perpendicular to the substrate 50, thereby tilting the coating slot 39 with respect to the substrate 50.

Figure 19:
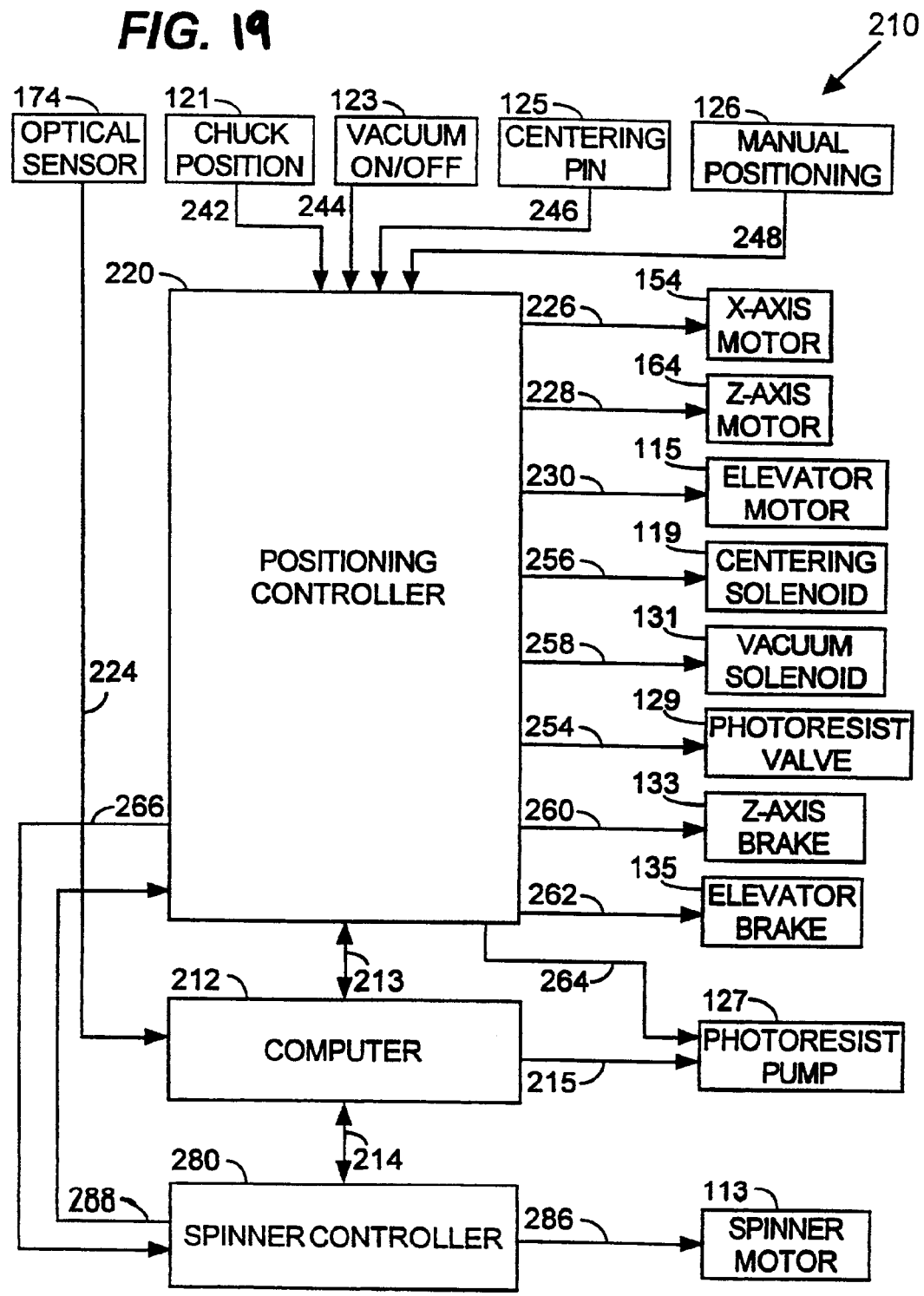
FIG. 19 is a block diagram of an embodiment of a control system in the extrusion spin coating assembly of the invention.

The description of the extrusion spin coating assembly 100 will be with reference to FIGS. 16, 17 and 18, which illustrate front, top and rear views, respectively, of an extrusion spin coating assembly 100 according to the invention. Components of the extrusion spin coating assembly 100 illustrated in FIGS. 16, 17 and 18 include a coating module 110 and a positioning system 130. Not illustrated in FIGS. 16, 17 and 18, but described with reference to FIG. 19, is a control system 210 which includes a positioning controller 220 and a spinner controller 280.

The coating module 110 includes a spinner assembly 111 which includes a spinner servomotor (not illustrated, reference numeral 113 in FIG. 19) connected to a vertical shaft 112. The vertical shaft 112 supports a Teflon vacuum chuck 114. The spinner assembly 111 can be moved vertically using a chuck elevator servomotor (not illustrated, reference numeral 115 in FIG. 19). The chuck elevator servomotor is equipped with an elevator motor brake (not illustrated, reference numeral 135 in FIG. 19). With the spinner assembly 111 at its lowest position, the chuck 114 is surrounded by a catch cup 116 (sectional view illustrated). The catch cup 116 is a circular cup having an open top 117. The upper portion 120 of the cup wall 118 tilts inward to facilitate retaining waste photoresist within the catch cup 116. The catch cup 116 serves three purposes. The catch cup 116 catches and drains waste photoresist out a liquid waste drain 122. The catch cup has an exhaust vent 118 through which evaporated solvent is removed. The catch cup 116 directs the flow of air over a spinning wafer to avoid turbulence. Both the exhaust vent 118 and waste drain 122 exit the bottom 124 of the catch cup 116. Means for removing waste photoresist and exhausted vapors are well known to those skilled in the art and are therefore not illustrated.

The spinner assembly 111 has a centering device including eight Teflon pins 138 for centering wafers on the chuck 114, and three vertical pins (not illustrated) for supporting loose wafers before and after processing. The centering pins 138 are controlled by a centering solenoid (not illustrated, reference numeral 119 in FIG. 19). Sensors on the coater module 110 indicate chuck 114 vertical home position (not illustrated, reference numeral 121 in FIG. 19), vacuum state (on/off) (not illustrated, reference numeral 123 in FIG. 19), and centering pin position (not illustrated, reference numeral 125 in FIG. 19). These features of the coating module 110 are well know to those skilled in the art and are therefore not illustrated.

A coater module 110 suitable for use with the invention is a 90SE coater module which is commercially available from Silicon Valley Group, Inc. The 90SE coater module is one component of a 90SE Wafer Processing track also commercially available from Silicon Valley Group, Inc.

The positioning system 130 is supported by an aluminum baseplate 132 which is mounted above the coater module 110. The baseplate 132 has a center cut-out 134 positioned over the coater module 110. First and second vertical support plates 134, 136 mounted above the baseplate support a cross-support 137 on which a two-axis positioning system 150 is mounted. The positioning system 150 includes an x-axis positioning table 152 and a z-axis positioning table 162. The x-axis positioning table 152 includes an x-axis table motor 154 and x-axis table base 156. Likewise, the z-axis positioning table 162 includes a z-axis table motor 164 and z-axis table base 166. The z-axis positioning table 162 also includes a z-axis brake (not illustrated, reference numeral 133 in FIG. 19). The z-axis positioning table 162 is mounted on the carriage 158 of the x-axis positioning table 152. The x-axis positioning table 152 moves in a horizontal plane, parallel to the surface 51 of a wafer 50 mounted on the chuck 114, and the z-axis positioning table 162 moves in a vertical direction perpendicular to the plane of the surface 51 of a wafer 50 mounted on the chuck 114. A positioning system suitable for use in the x-axis and z-axis positioning tables 152, 162 of the invention is the Parker Daedal Motion Table driven by 5-pitch ball screws.

An extrusion head 30 is mounted at the bottom of an aluminum extrusion head support 172 which, in turn, is mounted on the z-axis positioning table 162. The z-axis positioning table 162 has sufficient range of motion to move the extrusion head 30 from a position above the base plate 132, down, through the center cut-out 134 in the baseplate 132, to the proximity of a wafer 50 on the chuck 114.

An optical sensor 174 is mounted on the extrusion head support 172. The optical sensor 174 is used to measure the gap between the extrusion head 30 and a wafer 50 mounted on the chuck 114. A sensor suitable for use in an embodiment of the invention is a Philtec RC 140L reflectance compensated optical displacement sensor. The optical sensor 174 shines a light on the surface of the wafer 50, measures the reflected light, and generates a voltage proportional to the intensity of the measured light. The spot size of the Philtec sensor is 6 mm and has a bandwidth from DC to 100 Hz. The voltage-distance curve of the Philtec sensor is generally non-linear, but has a linear region when the sensor-wafer distance is between, for example, 5.51 and 6.17 mm (0.217 and 0.243 inch). The optical sensor 174 is positioned on the extrusion head support 172 so that all measurements fall within the linear range of the optical sensor 174.

Means for controlling flow of the photoresist includes a photoresist pump (not illustrated) and a photoresist shutoff valve 129. Such arrangements are well know to those skilled in the art, and therefore is not fully illustrated in FIG. 16, 17 or 18. However, the following description of the control system 210 of the extrusion spin coating assembly 100 includes reference to the photoresist pump (not illustrated, reference numeral 127 in FIG. 19) and the photoresist shutoff valve 129.

FIG. 19 is a block diagram which illustrates an embodiment of a control system 210 suitable for controlling the extrusion spin coating assembly 100 of the invention. The control system 210 includes a computer 212, a positioning controller 220 and a spinner controller 280. The computer 212 downloads programs to the positioning controller 220, the spinner controller 280 and the photoresist dispense pump 127 via serial interfaces 213, 214, 215. The positioning controller 220 sends commands to the photoresist dispense pump 127 to start and stop photoresist flow and to control the photoresist shutoff valve 129. The positioning controller 220 also controls the position of the x-axis positioning table 152 via the x-axis motor 154 and z-axis positioning table 162 via the z-axis motor 164, and the chuck elevator servomotor 115. The positioning controller 220 receives the output of the optical sensor 174, calculates the distance between the extrusion head 30 and the wafer 50, and uses the results to control the z-axis positioning table 162 via the z-axis motor 164.

A computer suitable for use in the control system 210 is an IBM-compatible PC. Suitable for use as the positioning controller 220 is the Parker Compumotor AT6450 Servo Controller, including the optional ANI analog input PC card and the AUX board. Suitable for use as the spinner controller 280 is The Pacific Scientific SC 755. Although the computer 212, positioning controller 220 and spinner controller 280 are shown separately in the block diagram of FIG. 19, in an embodiment which includes the Parker Compumotor AT6450 and Pacific Scientific SC755 controllers, the Compumotor AT6450 plugs into the motherboard of the PC. The invention also contemplates an embodiment in which both the positioning controller 220 and spinner controller 280 functions are provided by a single, combined controller.

The positioning controller 220 includes a positioning controller processor and several inputs and outputs. The inputs and outputs include a 14-bit analog to digital (A/D) converter, several discrete digital inputs and outputs, and servomotor outputs (the processor and inputs and outputs are well known to those skilled in the art and are not individually illustrated). The output of the optical sensor 174 is coupled to the A/D converter input 224. The positioning controller 220 discrete digital inputs are optically isolated interfaces, and include a chuck position home indicator input 242 coupled to the chuck position home sensor 121; a vacuum on/off status indicator input 244 coupled to the vacuum on/off sensor 123 on the vacuum chuck 114; a centering pin in/out position indicator input 246 coupled to the centering pin position sensor 125; and one or more manual positioning command inputs 248 coupled to operator manual positioning switches 126.

The positioning controller 220 outputs include an x-axis servomotor output 226 which is coupled to the x-axis servomotor 154; a z-axis servomotor output 228 which is coupled to the z-axis servomotor 164; and an elevator motor output 230 which is coupled to the elevator servomotor 115.

The positioning controller 220 discrete digital outputs include a photoresist valve on/off output 254 which is coupled to the photoresist shutoff valve 129; a centering solenoid output 256 which is coupled to the centering solenoid 119 which controls the centering pins 138; a vacuum solenoid output 258 which is coupled to the vacuum solenoid 131; a z-axis motor brake output 260 which is coupled to the z-axis brake 133 in the z-axis positioning table 162; an elevator motor brake output 262 which is coupled to the elevator motor brake 135; a trigger output 264 to the photoresist dispense pump 127; and logical outputs 266 to the spinner controller 280.

The spinner controller 280 runs the coating and spin cycles in response to signals received from the positioning controller 220. The spinner controller 280 includes a spinner controller processor, a servomotor output, and an encoder (the processor and encoder are well known to those skilled in the art and are not individually illustrated). The spinner controller 280 outputs include a spinner motor output 286 which is coupled to the spinner motor 113 The output of the spinner controller 280 also includes a simulated encoder signal 288 which is coupled to the positioning controller. The simulated encoder signal 288 allows electronic gearing of the spinner motor 113 speed to control the x-axis positioning of the extrusion head 30 performed by the positioning controller 220.

The extrusion head 30 and the positioning tables 152, 162 must be aligned with respect to a wafer 50 mounted on the chuck 114 to obtain reliable coating. Three alignments are required. These alignments will be described with reference to FIGS. 16, 17 and 18. A first alignment adjusts the path of the extrusion slot 39 so that the extrusion slot 39 passes directly over the center of a wafer 50 mounted on the chuck 114. This alignment is needed to completely cover the center area of the wafer 50. The extrusion head 30 is positioned over the center of the wafer 50 by sliding the vertical support plates 134, 136 forward or backward over the base plate 132. The motion of the vertical support plates 134, 136 is constrained by a guide on the base plate 132. Adjustment bolts at the rear of each of the vertical support plates 134, 136 allow fine tuning of the position of the vertical support plates 134, 136 before the vertical support plates 134, 136 are fastened into place.

The second alignment adjusts the angle of the x-axis with respect to the wafer surface 51. This alignment maintains a constant gap between the wafer 50 and the extrusion head 30 as the x-axis positioning table 152 changes position. The angle of the x-axis with respect to the wafer surface 51 can be changed by rotating the cross-support 138 about a first pivot 179 at one end of the cross-support 137. Fine and coarse adjustment bolts 184, 186 allow adjustments of the angle between the x-axis and the wafer surface 51 of $1.64\times10^{-5}$ radians per turn of the fine adjustment bolt 184. The angle of the x-axis with respect to the wafer surface 51 can be determined by scanning across the wafer surface 51 with the optical sensor 174. During the scan, with the z-axis fixed, measurements of the optical sensor 174 output and the x-position are recorded. A linear regression of these data pairs provides the angle between the wafer surface 51 and the x-axis.

The third alignment adjusts the bottom edge of the extrusion head 30, i.e. the extrusion slot 39, until it is parallel with the x-axis and the wafer surface 51. This alignment is crucial for maintaining a constant gap across the width of the extrusion head 30. The angle between the bottom edge of the extrusion head 30 and the x-axis can be adjusted using a wafer-extruder parallelism adjustment bolt 176. The wafer-extruder parallelism adjustment bolt 176 pivots the extrusion head support 172 about a wafer-extruder parallelism adjustment pivot 178 at the base of the z-axis positioning table 162. The angle between the x-axis and the bottom of the extrusion head 30 can be measured using a linear variable differential transformer (LVDT) sensor. The LVDT sensor is secured to the wafer surface 51 with the measurement tip pointing vertically up. Next, the extrusion head 30 is lowered until the lips 41, 42 of the extrusion head 30 move the LVTD sensor to a reference position. After the x-axis and z-axis positioning table 152, 162 positions are recorded, the procedure is repeated for several other positions along the extrusion head lips 41, 42. The slope of the extrusion head 30 with respect to the x-axis is determined using a linear regression of these data pairs.

The optical sensor 174 may be calibrated in a two-step process. First, a voltage offset (i.e., zero-gap bias) voltage is determined by measuring the output voltage of the optical sensor 174 at several small gap distances using precision shims placed between the extrusion head 30 and the wafer surface 51. A linear regression analysis of the gap distance and sensor voltage data is used to calculate the voltage offset (i.e., sensor voltage at a zero gap). Second, the relationship of the sensor voltage and the height of the extrusion slot 39, in the linear range of the optical sensor 174, is determined by raising the extrusion slot 39 in selected increments (e.g., 10 encoder counts equals 12.7 μm) and recording the sensor voltage at each position. A linear regression of the data pair provides the slope of the curve representing sensor voltage versus z-axis position of the extrusion slot 39. The extrusion head 30 must be aligned with respect to the x-axis and wafer surface, as described above, prior to calibrating the optical sensor 174 so that errors will not arise from the angle between the extrusion head 30 and the wafer surface 51.

The extrusion spin coating process will be described with reference to FIGS. 20–23. The alignment and calibration procedures described above may be performed periodically or prior to a series of runs as determined to be necessary based on experience with the equipment used.

Figure 20:
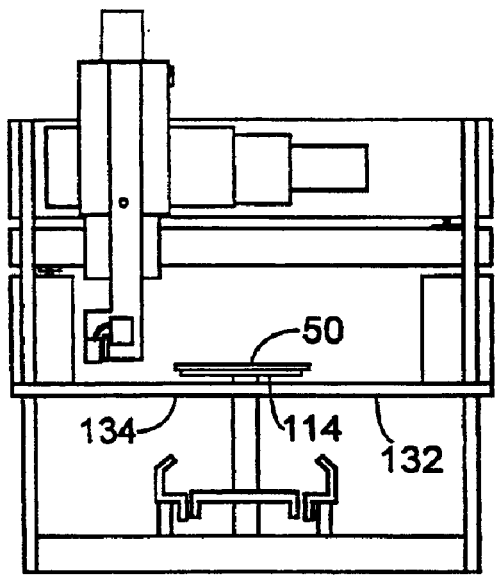
FIGS. 20, 21, 22 and 23 illustrate the configuration of an extrusion spin coating assembly during several steps of the extrusion spin coating process of the invention.
Figure 21:
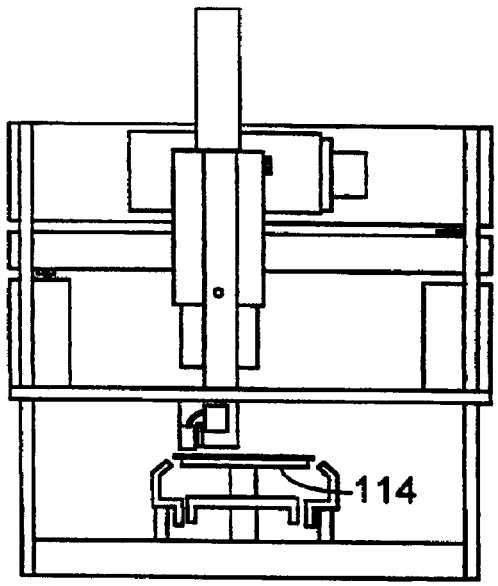
Figure 22:
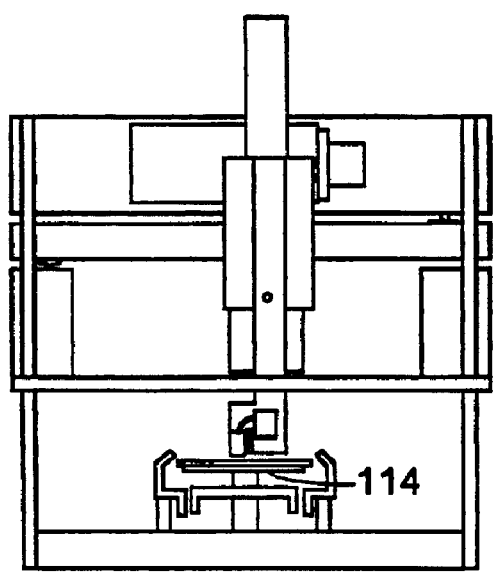

Referring to FIG. 20, the vacuum chuck 114 is raised through the cut out 134 in the base plate 132, and the wafer 50 is placed on the chuck 114. The wafer 50 is centered on the chuck 114 using the centering pins 138 (FIG. 17). The chuck vacuum (not illustrated) is turned on to secure the wafer 50. The chuck 114 is lowered, lowering the wafer 50 into the coating position, and the extrusion head 30 is lowered into position at the edge of the wafer 50 with the desired gap between the wafer 50 and the extrusion head lips 41, 42 as illustrated in FIG. 21. The chuck 114 is then rotated at an initial rotational speed which is the desired coating speed. The photoresist shutoff valve 129 is opened and the photoresist pump 127 is triggered to begin dispensing photoresist. The extrusion head 30 is moved radially with respect to the wafer 50. As the extrusion head 30 moves toward the center of the wafer 50, the rotational speed of the chuck 114 is increased and the extrusion head speed is increased at a rate proportional to the increase in the rotational speed in order to maintain the coating speed of the extrusion head 30 over the wafer 50 constant. When the leading edge of the extrusion head 30 reaches the center of the wafer 50, illustrated in FIG. 22, the speed of rotation of the wafer 30 is held constant until the trailing edge of the extrusion head 30 reaches the center of the wafer 50. When the entire wafer 50 is covered with photoresist, the photoresist pump 127 is triggered to stop dispensing photoresist, and the photoresist shutoff valve 129 is closed. Typically, it is necessary to continue extruding photoresist and continue moving the extrusion head 30 until the trailing edge of the extrusion head 30 reaches the center of the wafer 50 in order to cover the entire wafer 50 with photoresist. When the photoresist pump 127 and shutoff valve 129 are triggered to stop dispensing photoresist, a residual amount of photoresist which is already in the extrusion head 30 (and possibly also in tubing leading to the extrusion head 30) may continue to flow and be deposited on the wafer 50. In such cases, the photoresist pump 127 and shutoff valve 129 may be triggered to stop dispensing photoresist a short time prior to covering the entire wafer 50, thereby allowing such residual photoresist to finish covering the wafer 50.

Figure 23:
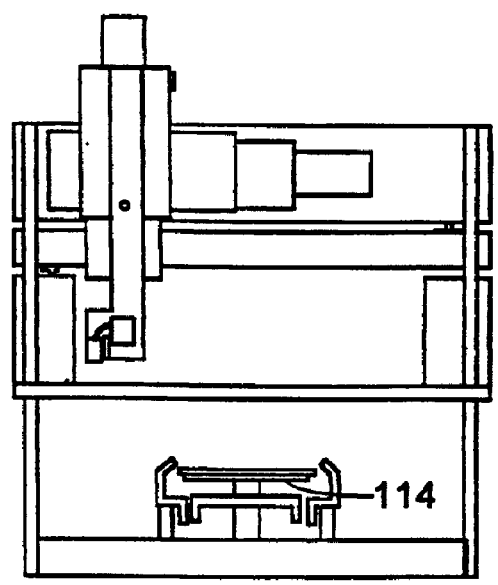

The chuck 114 then lowers the wafer 50 into the catch cup 116, and the extrusion head 30 is raised from the coating area as illustrated in FIG. 23. The wafer 50 is then spun at high speed to remove excess photoresist and achieve the desired coating uniformity. The chuck 114 stops spinning and is raised through the center cut out 134 in the base plate 132. The vacuum is turned off and the wafer 50 removed from the chuck 114.

Figure 24:
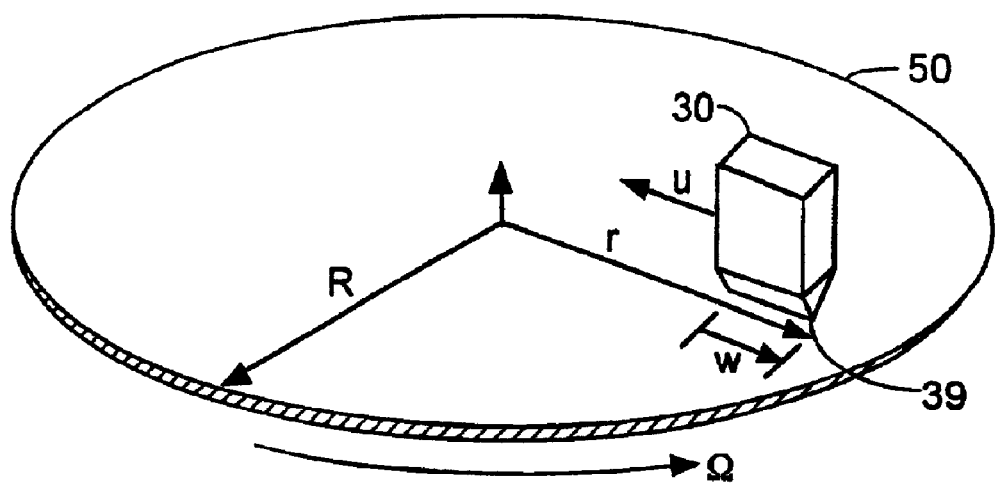
FIG. 24 is a diagram which illustrates certain parameters of extrusion spin coating motion according to the invention.

FIG. 24 is a diagram which illustrates certain parameters of extrusion spin coating motion according to the invention. In FIG. 24, a wafer 50, has a radius R, and is rotating about its center at an angular velocity of $\Omega$. An extrusion head 30 is above the wafer 50, with the extrusion slot 39 radially aligned with respect to the wafer 50. The extrusion slot 39 has a width w, and is moving radially with respect to the wafer 50 at a velocity u. The distance between the center of the wafer 50 and the trailing edge of the extrusion head 30 is r.

The tangential velocity of any point on the surface of the wafer 50, at a distance r from the axis of rotation shown in FIG. 24 is:

$$v = \Omega r$$

With the trailing edge of the extrusion head 30 at a distance r from the axis of rotation, a spiral extrusion pattern can be made by moving the extrusion head 30 inward one length of the extrusion slot 39 for each revolution of the wafer 50. The extrusion head 30 speed along the diameter of the wafer 50 is then:

$$u = \frac{\Omega w}{2\pi}$$

Solving for $\Omega$ and substituting yields:

$$u = \frac{wv}{2\pi r}$$

For radially inward motion, $u = -dr/dt$, and a differential equation for the position of the extrusion head can be obtained as follows:

$$\frac{dr}{dt} = -\frac{wv}{2\pi r}$$

Integrating this equation using the initial condition $r = r_0$ at time $t = 0$ yields:

$$r = \left(r_0^2 - \frac{wvt}{\pi}\right)^{1/2}$$

The wafer rotation speed can be expressed as a function of time as:

$$\Omega = \frac{v}{\left(r_0^2 - \frac{wvt}{\pi}\right)^{1/2}}$$

and the head speed can be expressed as a function of time as:

$$u = \frac{wv}{2\Pi\left(r_0^2 - \frac{wvt}{\pi}\right)^{1/2}}$$

Figure 25:
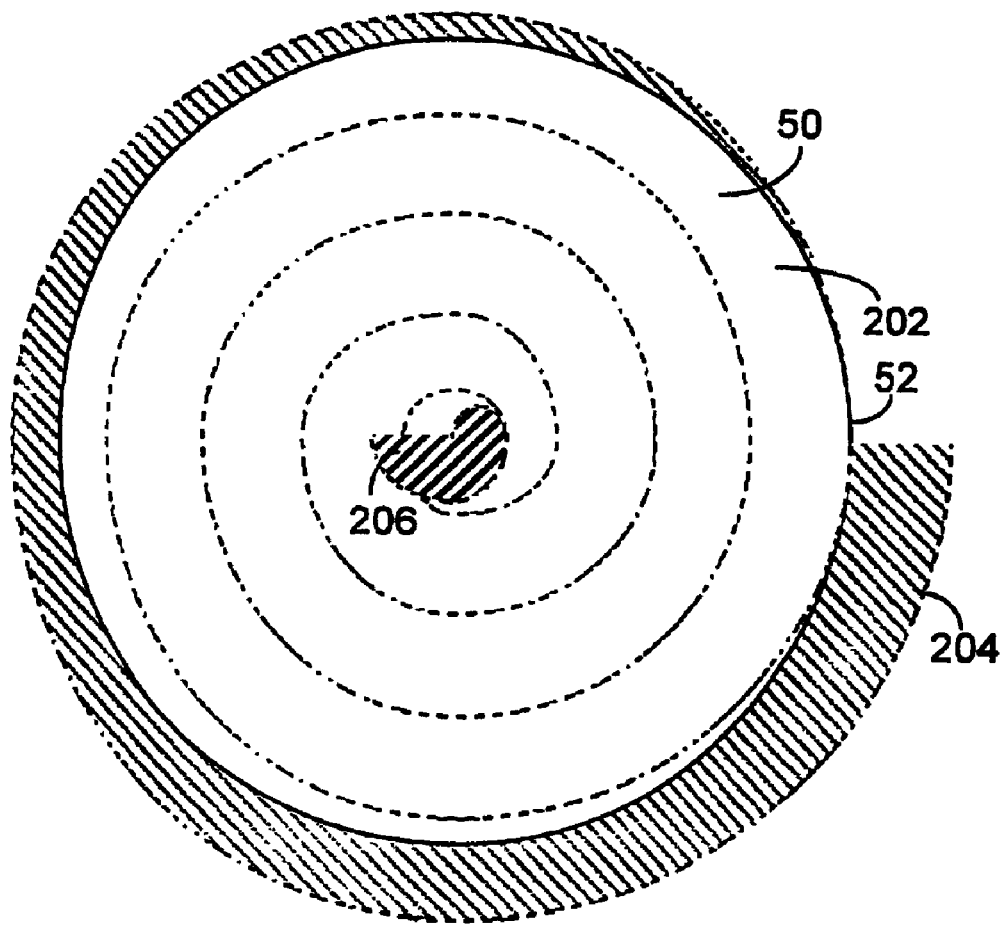
FIG. 25 illustrates an extrusion spin coating spiral pattern according to the invention.

FIG. 25 illustrates an extrusion spin coating spiral pattern 202 according to one aspect of the invention. The spiral pattern 202 results from the extrusion head 30 starting at the outer edge 52 of the wafer 50 and moving radially inward toward the center of the wafer 50. A first shaded region 204 represents wasted photoresist at the outer edge of the wafer 50, and a second shaded region 206 represents a double thickness of photoresist extruded in the center region of the wafer 50. It is necessary to start the process with the extrusion head 50 just off the outer edge 52 of the wafer 50 to cover the entire outer edge 52 with the extruded spiral pattern 202 without unnecessary overlap or double thickness around the outer edge 52 of the wafer 50. This results in the first shaded region 204 of wasted photoresist. Likewise, it is necessary to continue to extrude photoresist after the leading edge of the extrusion head 30 reaches the center of the wafer 50 until the entire wafer 50 is covered. Typically, it will be necessary to continue the process until the trailing edge of the extrusion head 30 reaches the center to cover the entire center region of the wafer 50. The overlap in the second shaded region 206 at the center of the wafer 50 is inevitable because of the finite width of the extrusion head 30. However, the amount of wasted and excess photoresist is relatively small, and the efficiency of the extrusion spin coating process far exceeds the efficiency of prior spin coating processes.

FIG. 25 illustrates an extrusion spin coating spiral pattern which results from starting the extrusion head at the outer edge of the wafer and, while spinning the wafer, moving the extrusion head radially inward toward the center of the wafer. The method and apparatus of the invention may instead start the extrusion head at the center of the wafer and move the extrusion head radially outward toward the outer edge of the wafer.

In general, extrusion coating results in an initial layer of coating material that is thin (typically 20–40 micrometers according to the methods described above). Since the initial layer is thin, the solvent concentration contained in the initial coating layer may change fairly rapidly due to evaporation. As a result, the coating material's viscosity at a point on the wafer will change with time since the viscosity depends on the solvent concentration. Since a finite time is required to extrude a coating on the entire wafer, the coating viscosity over the wafer surface is non-uniform. This non-uniform condition prior to subsequent spin-drying increases non-uniformity of the final coating thickness.

To improve the final coating uniformity, embodiments of the invention control the concentration of solvent vapor in the gaseous environment surrounding the coating to be at least 50% (saturation). In different embodiments, the concentration of solvent vapor is controlled by different techniques, including but not limited to mixing gas streams having differing solvent vapor concentrations, bubbling gas through a liquid solvent, and injecting small droplets of liquid solvent into a gas stream with an atomizer. Many techniques are apparent to a skilled person.

Figure 26:
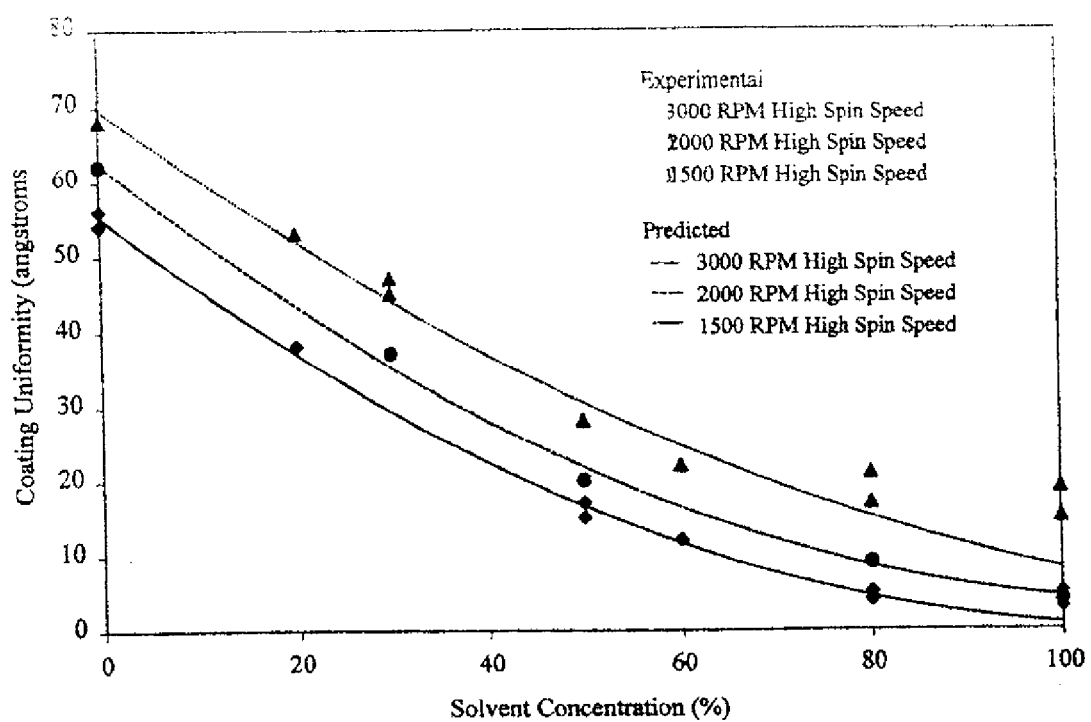
FIG. 26 illustrates the variation of final coating uniformity with solvent vapor concentration.

FIG. 26 shows examples of experimental and computational results for an embodiment utilizing an extrusion-coating method and apparatus, described supra, followed by spinning at 1500–3000 rpm. As shown in FIG. 26, the coating uniformity improves as the solvent concentration in the gaseous environment is increased towards saturation. Solvent vapor concentrations greater than about 50% of saturation are preferred. For coating uniformity to be within about 15 angstroms over a wafer, a solvent vapor concentration greater than about 80% of saturation is preferred.

It will be readily apparent to those skilled in the art that this invention is not limited to the embodiments described above. Different configurations and embodiments can be developed without departing from the scope of the invention and are intended to be included within the scope of the claims.

What is claimed is:

1. A method of coating a surface of a substrate with a polymer solution comprising:
   mounting the substrate inside an enclosed housing;
   controlling a solvent vapor concentration of a control gas to be between approximately 42% and 80%;
   passing the control gas into the housing through an inlet;
   extruding the polymer solution onto the surface of the substrate in the housing;
   spinning the substrate; and
   exhausting the control gas and any solvent vapor and particulate contaminants suspended in the control gas from the housing through an outlet.

2. The method of claim 1, wherein the substrate is a wafer having a top surface, a center, and an outer edge; and
   wherein extruding the polymer solution comprises extruding a ribbon of photoresist, the ribbon having a width, the ribbon covering the entire top surface of the substrate in a spiral pattern, wherein the photoresist is extruded from the extrusion slot at a rate which is a constant extrusion rate, and with the substrate rotating at a rotational speed, and the extrusion head moving at a radial speed, the motion of a radially moving extrusion head with respect to the rotating substrate is at a tangential velocity which is a constant tangential velocity.

3. A method according to claim 2, wherein the ribbon of photoresist is extruded in a spiral pattern beginning at the outer edge of the wafer and ending at the center of the wafer.

4. A method according to claim 2, wherein the ribbon of photoresist is extruded in a spiral pattern beginning at the center of the wafer and ending at the outer edge of the wafer.

5. A method according to claim 2, wherein the width of the photoresist ribbon is between about one tenth and about one third of the diameter of the wafer.

6. The method of claim 2, wherein controlling a solvent vapor concentration comprises:
   passing a first solvent vapor-bearing gas and a second gas to the housing along conduits in which electrically-controlled valves are mounted, the valves controlling a gas flow rate into the housing and the composition of the control gas flowing into the housing.

7. The method of claim 2, wherein the control gas comprises at least one species selected from a group consisting of air, nitrogen, and noble gases.

8. The method of claim 2, wherein the polymer solution contains a photoresist polymer.

9. The method of claim 2, further comprising passing solvent-free, humid gas over the coated substrate.

10. The method of claim 1, wherein:
    the substrate is a wafer having a top surface, a center, a diameter, and an outer edge;
    mounting the substrate inside an enclosed housing includes mounting the wafer on a chuck, the top surface of the wafer aligned horizontally and oriented upward; and
    extruding the polymer solution comprises:
    positioning an extrusion head adjacent to the outer edge of the wafer and above the top surface of the wafer, the extrusion head configured to extrude photoresist out an extrusion slot, the extrusion slot having a length bounded by a first end and a second end, the extrusion head positioned with the extrusion slot aligned radially with respect to the wafer, the first end of the extrusion slot located adjacent to the outer edge of the wafer, and the second end of the extrusion slot outside the outer edge of the wafer,
    rotating the wafer about its center, wherein with the wafer rotating at a rotational speed, and the extrusion head moving at a radial speed, the motion of a radially moving extrusion head with respect to the rotating wafer is a tangential velocity which is a constant tangential velocity;
    extruding a ribbon of photoresist from the extrusion slot, the ribbon having a width which is substantially equal to the length of the slot, wherein the photoresist is extruded from the extrusion slot at a rate which is a constant extrusion rate, and
    while extruding photoresist from the extrusion slot, and maintaining the extrusion slot aligned radially with respect to the wafer, moving the extrusion head radially inward from the outer edge of the wafer toward the center of the wafer until the photesist covers the entire top of the surface of the wafer.

11. A method according to claim 10, wherein the length of the extrusion slot is between about one tenth and one third of the diameter of the semiconductor wafer.

12. A method according to claim 10, wherein maintaining the extrusion slot aligned radially with respect to the wafer further comprises uniformly maintaining the extrusion slot at a distance above the top surface of the wafer.

13. A method according to claim 10, wherein maintaining the extrusion slot aligned radially with respect to the wafer further comprises determining a distance between the extrusion slot and the top surface of the wafer, and adjusting the position of the extrusion slot to maintain the distance.

14. A method according to claim 13, wherein maintaining the extrusion slot aligned radially with respect to the wafer further comprises determining a distance between the extrusion slot and the top surface of the wafer using an optical sensor.

15. A method according to claim 10, wherein the photoresist ribbon is coated onto the wafer in a spiral pattern which covers the entire top surface of the wafer.

16. A method according to claim 15, comprising the steps of
removing the extrusion head, and
rotating the wafer at high speed.

17. The method of claim 10, wherein controlling a solvent vapor concentration comprises:
passing a first solvent vapor-bearing gas and a second gas to the housing along conduits in which electrically-controlled valves are mounted, the valves controlling a gas flow rate into the housing and the composition of the control gas flowing into the housing.

18. The method of claim 10, wherein the control gas comprises at least one species selected from a group consisting of air, nitrogen, and noble gases.

19. The method of claim 10, wherein the polymer solution contains a photoresist polymer.

20. The method of claim 10, further comprising passing solvent-free, humid gas over the coated substrate.

21. The method of claim 1, wherein:
the substrate is a wafer having a top surface, a center, a diameter, and an outer edge;
mounting the substrate inside an enclosed housing comprises mounting the wafer on a chuck; and
extruding the polymer solution comprises: positioning an extrusion head at the center of the wafer and above the top surface of the wafer, the extrusion head configured to extrude photoresist out an extrusion slot, the extrusion slot having a length bounded by a first end and a second end, the extrusion head positioned with the extrusion slot aligned radially with respect to the wafer, the first end of the extrusion slot located at the center of the wafer and the second end of the extrusion slot located between the center of the wafer and the outer edge of the wafer,
rotating the wafer about its center wherein with the wafer rotating at a rotational speed, and the extrusion head moving at a radial speed, the motion of radially moving extrusion head with respect to the rotating wafer is at a tangential velocity which is a constant tangential velocity,
extruding a ribbon of photoresist from the extrusion slot, the ribbon having a width substantially equal to the length of the slot, wherein the photoresist is extruded from the extrusion slot at a rate which is a constant extrusion rate, and
while extruding photoresist from the extrusion slot, and maintaining the extrusion slot aligned radially with respect to the wafer, moving the extrusion head radially outward toward the outer edge of the wafer until the photoresist covers the entire top surface of the wafer.

22. The method of claim 21, wherein controlling a solvent vapor concentration comprises:
passing a first solvent vapor-bearing gas and a second gas to the housing along conduits in which electrically-controlled valves are mounted, the valves controlling a gas flow rate into the housing and the composition of the control gas flowing into the housing.

23. The method of claim 21, wherein the control gas comprises at least one species selected from a group consisting of air, nitrogen, and noble gases.

24. The method of claim 21, wherein the polymer solution contains a photoresist polymer.

25. The method of claim 21, further comprising passing solvent-free, humid gas over the coated substrate.

26. The method of claim 1, wherein controlling a solvent vapor concentration comprises:
passing a first solvent vapor-bearing gas and a second gas to the housing along conduits in which electrically-controlled valves are mounted, the valves controlling a gas flow rate into the housing and the composition of the control gas flowing into the housing.

27. The method of claim 1, wherein the control gas comprises at least one species selected from a group consisting of air, nitrogen, and noble gases.

28. The method of claim 1, wherein the polymer solution contains a photoresist polymer.

29. The method of claim 1, further comprising passing solvent-free, humid gas over the coated substrate.

30. The method of claim 29, wherein a humidity of the humid gas is controlled by means of a temperature and humidity controller.

31. The method of claim 30, wherein the humidity of a humid gas is controlled to have the relative humidity in the range of 40% to 45%.

32. The method of claim 1, wherein the temperature of a humid gas is controlled by means of a temperature and humidity controller.

* * * * *